(12) United States Patent
Ehsan et al.

(10) Patent No.: US 12,139,798 B2
(45) Date of Patent: Nov. 12, 2024

(54) ELECTROCATALYST WITH A NiMoO4 LAYER WITH NANOFLOWER MORPHOLOGY

(71) Applicant: KING FAHD UNIVERSITY OF PETROLEUM AND MINERALS, Dhahran (SA)

(72) Inventors: Muhammad Ali Ehsan, Dhahran (SA); Abuzar Khan, Dhahran (SA)

(73) Assignee: KING FAHD UNIVERSITY OF PETROLEUM AND MINERALS, Dhahran (SA)

(*) Notice: Subject to any disclaimer, the term of this patent is extended or adjusted under 35 U.S.C. 154(b) by 0 days.

(21) Appl. No.: 18/336,394

(22) Filed: Jun. 16, 2023

(65) Prior Publication Data

US 2024/0124991 A1    Apr. 18, 2024

Related U.S. Application Data

(62) Division of application No. 17/853,217, filed on Jun. 29, 2022, now Pat. No. 11,767,601.

(51) Int. Cl.
C25B 11/02 (2021.01)
C23C 16/40 (2006.01)
(Continued)

(52) U.S. Cl.
CPC ............ *C25B 11/02* (2013.01); *C23C 16/405* (2013.01); *C23C 16/406* (2013.01);
(Continued)

(58) Field of Classification Search
None
See application file for complete search history.

(56) References Cited

U.S. PATENT DOCUMENTS

| 5,278,138 A | 1/1994 | Ott et al. |
| 11,183,343 B1 | 11/2021 | Obaidat et al. |
| 2021/0214850 A1 | 7/2021 | Ehsen et al. |

FOREIGN PATENT DOCUMENTS

| CN | 107591251 A | 1/2018 |
| CN | 112290001 A | 1/2021 |
| CN | 113304756 A | 8/2021 |

OTHER PUBLICATIONS

Yedluri et al. Energies 2019, 12, 1143 (Year: 2019).*

(Continued)

*Primary Examiner* — Wojciech Haske
(74) *Attorney, Agent, or Firm* — Oblon, McClelland, Maier & Neustadt, L.L.P.

(57) ABSTRACT

A rapid method of synthesizing nanoflowers made of nanoflakes of nickel molybdate (NiMoO$_4$) directly on nickel foam (NF) through an aerosol-assisted chemical vapor deposition (AACVD) process is disclosed. The nickel molybdate nanoflowers were grown on NF by varying the deposition time for 60 and 120 min at a fixed temperature of 480° C. and their efficiency was investigated as oxygen evolution reaction (OER) catalysts in 1 M KOH electrolyte. The NiMoO$_4$ nanoflowers of NF obtained after 60 minutes of AACVD process showed OER performance with lowest overpotential of 320 mV to reach standard current density of 10 mA cm$^{-2}$. The catalyst continuously performed the OER for 15 h, signifying its prominent stability under electrochemical conditions.

11 Claims, 13 Drawing Sheets

(51) Int. Cl.
    *C23C 16/448*    (2006.01)
    *C25B 1/04*      (2021.01)
    *C25B 11/052*    (2021.01)
    *C25B 11/061*    (2021.01)
    *C25B 11/077*    (2021.01)

(52) U.S. Cl.
    CPC ............ *C23C 16/4486* (2013.01); *C25B 1/04* (2013.01); *C25B 11/052* (2021.01); *C25B 11/061* (2021.01); *C25B 11/077* (2021.01)

(56) References Cited

OTHER PUBLICATIONS

Dürr et al. ACS Nano 2021, 15, 13504-13515 (Year: 2021).*
Tombesi, et al. ; Aerosol-assisted chemical vapour deposition of transparent superhydrophobic film by using mixed functional alkoxysilanes ; Scientific Reports ; May 17, 2019 ; 12 Pages.
Solomon, et al. ; NiMoO4@Co3O4 Core-Shell Nanorods: In Situ Catalyst Reconstruction toward High Efficiency Oxygen Evolution Reaction ; Advanced Energy Materials 11 ; 2021 ; 14 Pages.
Karuppasamy, et al. ; Metal-organic framework derived NiMo polyhedron as an efficient hydrogen evolution reaction electrocatalyst ; Applied Surface Science, vol. 478 ; pp. 916-923 ; Jun. 1, 2019 ; Abstract Only ; 2 Pages.

* cited by examiner

ELECTROCATALYST WITH A NiMoO4 LAYER WITH NANOFLOWER MORPHOLOGY

CROSS-REFERENCE TO RELATED APPLICATIONS

The present application is a Divisional of U.S. application Ser. No. 17/853,217, now allowed, having a filing date of Jun. 29, 2022.

STATEMENT OF PRIOR DISCLOSURE BY THE INVENTOR

Aspects of the present disclosure are described in M. A. Ehsan; "Aerosol-Assisted Chemical Vapor Deposition Growth of NiMoO$_4$ Nanoflowers on Nickel Foam as Effective Electrocatalysts toward Water Oxidation"; Nov. 11, 2021; ACS Omega, incorporated herein by reference in its entirety.

BACKGROUND

Technical Field

This invention is related to fabrication of electrocatalysts derived from transition metals and the use of the electrocatalysts in water oxidation reactions. The fabrication of electrocatalysts includes aerosol-assisted chemical vapor deposition of certain transition metal complexes on a nickel substrate.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present invention.

Existing non-renewable, exhaustible energy resources are a considerable risk to the living environment. The enormous amount of $CO_2$ in the atmosphere (surpassing 400 ppm) has become a major global problem that needs to be addressed by developing and employing sustainable and renewable energy alternative energy sources such as hydrogen. High-energy-density, $CO_2$-neutral, and eco-friendly hydrogen-based fuels can potentially serve as a versatile feedstock for the synthesis of valuable chemicals. In this regard, hydrogen, obtained from a photoelectrochemical and electrochemical water splitting process, is the only clean and economically viable energy source that is green and with zero emission. In addition, the abundant water supply ensures the sustainable production of hydrogen over long periods.

Electrochemical water splitting occurs in two reaction steps: the hydrogen evolution reaction (HER) and the oxygen evolution reaction (OER). The OER is considered more challenging than the HER, as it uses four electrons to release $O_2$ and thus requires more energy to complete. Completing these reactions faster requires highly efficient and long-lived electrocatalysts (ECs). Conventionally, noble metal catalysts (Ir/Ru oxides) were used as electrocatalysts, however, their high price and scarcity are the major hurdles to advancing their water splitting applications. Further, a range of electrocatalyst materials including inexpensive and widespread transition-metal-based mono metals and binary metal alloys/oxides, metal nitrides, transition metal chalcogenides, metal phosphides, and metal-free carbon materials, have been reported extensively for use as electrocatalysts. However, for economic viability, despite all those advancements, some competent and modest electrocatalytic systems, obtainable by straightforward methods and inexpensive precursors with high electroactive sites and enhanced catalytic activity, still need to be disclosed.

SUMMARY

Aspects of this invention provide a method of making an electrocatalyst, comprising aerosol-assisted chemical vapor depositing a mixture comprising Ni(acac)$_2$ and MoO$_2$(acac)$_2$ on a substrate to form NiMoO$_4$ nanoflowers on the substrate, wherein the substrate is a nickel foam. In certain embodiments, the NiMoO$_4$ nanoflowers have a crystal structure by XRD and are in a form of irregularly aggregated nanosheets.

Certain embodiments of this invention also provide a method of making an electrocatalyst, comprising aerosol-assisted chemical vapor depositing a mixture comprising Ni(acac)$_2$ and MoO$_2$(acac)$_2$ on a substrate to form NiMoO$_4$ nanoflowers on the substrate wherein the electrocatalyst has a crystalline single phase NiMoO$_4$ nanoflowers. In certain aspects of this invention, the NiMoO$_4$ nanoflowers have a crystalline single phase by X-ray Diffraction (XRD) and X-ray Photon Spectroscopy (XPS).

In certain other embodiments, this invention also provides a method of making an electrocatalyst, comprising aerosol-assisted chemical vapor depositing a mixture comprising Ni(acac)$_2$ and MoO$_2$(acac)$_2$ on a substrate to form NiMoO$_4$ nanoflowers on the substrate, wherein the electrocatalyst has a surface of vertically aligned nanosheets assembled into the NiMoO$_4$ nanoflowers.

Certain other embodiments of this invention provide an electrocatalyst produced by a method comprising aerosol-assisted chemical vapor depositing a mixture comprising Ni(acac)$_2$ and MoO$_2$(acac)$_2$ on a substrate to form NiMoO$_4$ nanoflowers on the substrate, wherein the substrate is a nickel foam. In certain aspects of this invention, the NiMoO$_4$ nanoflowers have a crystal structure and are in the form of nanosheets. In certain embodiments of this invention, the electrocatalyst has a crystalline single phase NiMoO$_4$. Further in certain other embodiments of this invention, the electrocatalyst has a surface that is vertically aligned nanosheets assembled into NiMoO$_4$ nanoflowers. In yet other embodiments of this invention, the NiMoO$_4$ nanoflowers have a crystalline single phase by XRD and XPS.

Aspects of this invention also provide a method of using an electrocatalyst for water oxidation wherein the electrocatalyst is made by a process comprising aerosol-assisted chemical vapor depositing a mixture comprising Ni(acac)$_2$ and MoO$_2$(acac)$_2$ on a substrate to form NiMoO$_4$ nanoflowers on the substrate wherein the substrate is a nickel foam and wherein, the process further comprises contacting the electrocatalyst with an aqueous electrolyte solution having a pH of 8 to 14; and applying a potential of 1.30 to 1.70 V to the electrocatalyst and a counter electrode immersed in the aqueous electrolyte solution.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
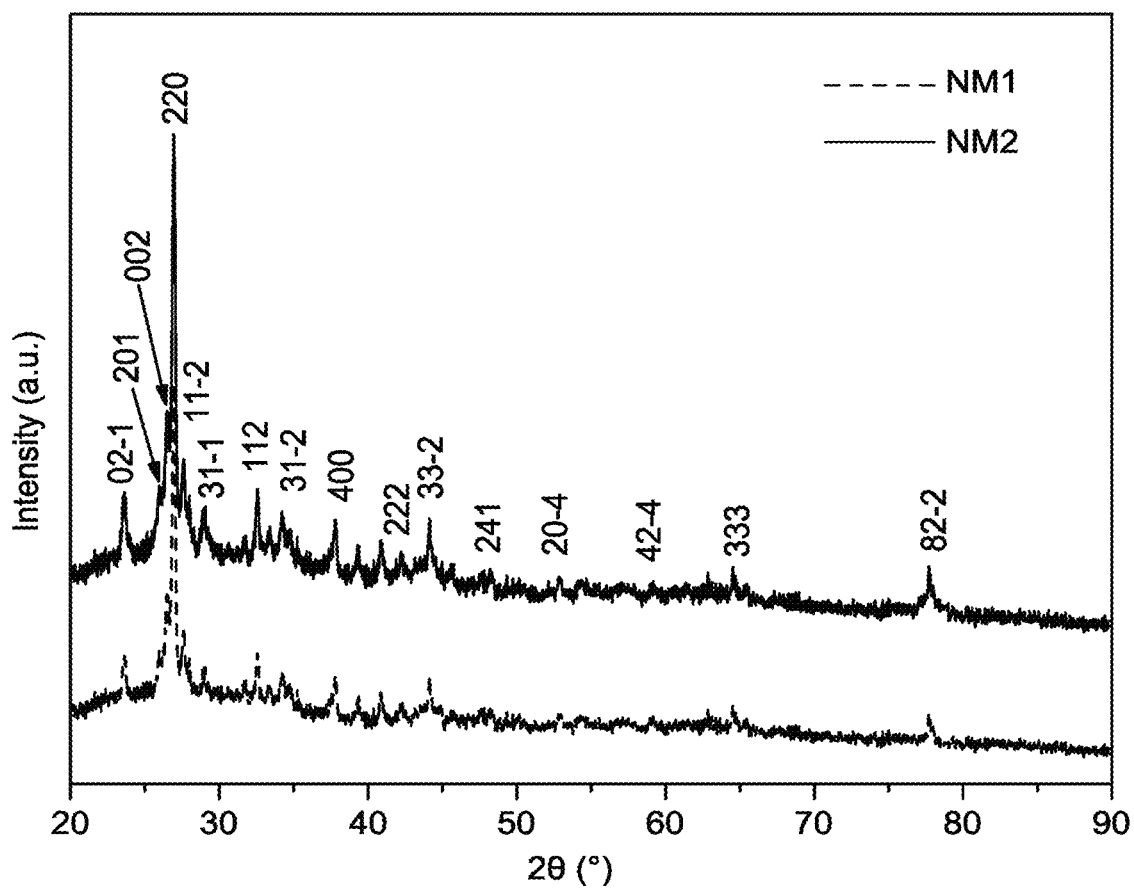
FIG. 1 shows X-Ray Diffraction (XRD) patterns of single phased NiMoO$_4$ samples prepared for 60 and 120 min via aerosol-assisted chemical vapor deposition (AACVD).

The present disclosure will be better understood with reference to the following definitions.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

In the drawings, like reference numerals designate identical or corresponding parts throughout the several views. Further, as used herein, the words "a," "an" and the like generally carry a meaning of "one or more," unless stated otherwise. Also, the use of "or" means "and/or" unless stated otherwise. Similarly, "comprise," "comprises," "comprising" "include," "includes," and "including" are interchangeable and not intended to be limiting.

Furthermore, the terms "approximately," "approximate," "about," and similar terms generally refer to ranges that include the identified value within a margin of 20%, 10%, or preferably 5%, and any values there between. For example, if a stated value is about 8.0, the value may vary in the range of 8±1.6, ±1.0, ±0.8, ±0.5, ±0.4, ±0.3, ±0.2, or ±0.1.

Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10 it also describes subranges for Parameter X including 1-9, 1-8, 1-7, 2-9, 2-8, 2-7, 3-9, 3-8, 3-7, 2-8, 3-7, 4-6, or 7-10, 8-10 or 9-10 as mere examples. A range encompasses its endpoints as well as values inside of an endpoint, for example, the range 0-5 includes 0, >0, 1, 2, 3, 4, <5 and 5.

As used herein, the words "preferred" and "preferably" refer to embodiments of the technology that afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the technology.

As referred to herein, all compositional percentages are by weight of the total composition, unless otherwise specified. As used herein, the word "include," and its variants, is intended to be non-limiting, such that recitation of items in a list is not to the exclusion of other like items that may also be useful in the materials, compositions, devices, and methods of this technology.

The present disclosure further includes all isotopes of atoms occurring in the present compounds. Isotopes include those atoms having the same atomic number but different mass numbers. By way of general example, and without limitation, isotopes of hydrogen include deuterium and tritium, isotopes of oxygen include $^{16}O$, $^{17}O$ and $^{18}O$. Isotopically labeled compounds of the disclosure can generally be prepared by conventional techniques known to those skilled in the art or by processes and methods analogous to those described herein, using an appropriate isotopically labeled reagent in place of the non-labeled reagent otherwise employed.

As defined here, an aerosol is a suspension of solid or liquid particles in a gas. An aerosol includes both the particles and the suspending gas. Primary aerosols contain particles introduced directly into the gas, while secondary aerosols form through gas-to-particle conversion. There are several measures of aerosol concentration. Environmental science and health fields often use the mass concentration (M), defined as the mass of particulate matter per unit volume with units such as µg/m³. Also commonly used is the number concentration (N), the number of particles per unit volume with units such as number/m³ or number/cm³. The size of particles has a major influence on their properties, and the aerosol particle radius or diameter (dP) is a key property used to characterize aerosols. Aerosols vary in their dispersity. A monodisperse aerosol, producible in the laboratory, contains particles of uniform size. Most aerosols, however, as polydisperse colloidal systems, exhibit a range of particle sizes. Liquid droplets are almost always nearly spherical, but scientists use an equivalent diameter to characterize the properties of various shapes of solid particles, some very irregular. The equivalent diameter is the diameter of a spherical particle with the same value of some physical property as the irregular particle. The equivalent volume diameter (de) is defined as the diameter of a sphere of the same volume as that of the irregular particle. Also commonly used is the aerodynamic diameter. The aerodynamic diameter of an irregular particle is defined as the diameter of the spherical particle with a density of 1000 kg/m³ and the same settling velocity as the irregular particle.

As used herein, nanoflowers are particles exhibiting a characteristic three-dimensional flowerlike morphology.

The present disclosure relates to a method of producing electrocatalysts. This method involves contacting an aerosol with a substrate to deposit a nanostructured layer onto the substrate, thereby forming the electrocatalyst. As described here, "contacting an aerosol with a substrate" is considered to be synonymous with "contacting a substrate with an aerosol." Both phrases mean that the substrate is exposed to the aerosol, so that a portion of the suspended particles of the aerosol directly contact the substrate. Contacting may also be considered equivalent to "introducing" or "depositing," such as "depositing an aerosol onto a substrate." In one embodiment, the contacting may be considered aerosol-assisted chemical vapor deposition (AACVD). In one embodiment, the method of making the electrocatalyst may be considered a one-step method, as the formation of the nanostructured layer takes place immediately following and/or during the contacting of the aerosol with the substrate.

Aspects of this invention provide a method of making an electrocatalyst, comprising aerosol-assisted chemical vapor depositing a mixture comprising nickel and molybdenum precursors on a substrate to form nanoflowers on the substrate. The aerosol contains a carrier gas, a mixture comprising nickel and molybdenum precursors, and a solvent. In one embodiment, the aerosol consists of, or consists essentially of, a carrier gas, a mixture comprising nickel and molybdenum precursors, and a solvent before the contacting, preferably immediately before the contacting. Preferably, the mixture comprising nickel and molybdenum precursors is dissolved or dispersed in the solvent. In one embodiment, the mixture comprising nickel and molybdenum precursors has an acetylacetone or acetylacetonate (acac) ligand, a trifluoro-acetate (TFA) ligand, an acetate ligand (OAc), an isopropanol (ⁱPrOH) ligand, a tetrahydrofuran (THF) ligand, and/or a water ($H_2O$) ligand. In one embodiment, the substrate is a metal substrate. The precursors may include vanadium and cobalt in addition to the Ni and Mo. A metal substrate is a at least one selected from the group consisting of tin, aluminum, zinc, and nickel foam. In one embodiment, the substrate is nickel foam. In one embodiment, the nanoflowers are $NiMoO_4$ nanoflowers. In certain embodiments, the $NiMoO_4$ nanoflowers have a crystal structure by XRD and are in a form of nanosheets.

Exemplary solvents applicable to the method disclosed herein include, but are not limited to, toluene, tetra-hydrofuran, acetic acid, acetone, acetonitrile, butanol, dichloromethane, chloroform, chlorobenzene, dichloroeth-ane, diethylene glycol, diethyl ether, dimethoxy-ethane, dimethyl-formamide, dimethyl sulfoxide, ethanol, ethyl acetate, ethylene glycol, heptane, hexamethylphosphoramide, hexamethylphosphorous triamide, methanol, methyl t-butyl ether, methylene chloride, pentane, cyclopentane, hexane, cyclohexane, benzene, dioxane, propanol, isopropyl alcohol, pyridine, triethyl amine, propandiol-1,2-carbonate, ethylene carbonate, propylene carbonate, nitrobenzene, formamide, γ-butyrolactone, benzyl alcohol, n-methyl-2-pyrrolidone, acetophenone, benzonitrile, valeronitrile, 3-methoxy propionitrile, dimethyl sulfate, aniline, n-methylformamide, phenol, 1,2-dichlorobenzene, tri-n-butyl phosphate, ethylene sulfate, benzenethiol, dimethyl acetamide, N,N-dimethylethaneamide, 3-methoxypropionnitrile, diglyme, cyclohexanol, bromobenzene, cyclohexanone, anisole, diethylformamide, 1-hexanethiol, ethyl chloroacetate, 1-dodecanthiol, di-n-butylether, dibutyl ether, acetic anhydride, m-xylene, o-xylene, p-xylene, morpholine, diisopropyletheramine, diethyl carbonate, 1-pentandiol, n-butyl acetate, and 1-hexadecanthiol. In one embodiment, the solvent comprises pyridine, N,N-dimethylformamide (DMF), N,N-dimethylacetamide, N-methyl pyrrolidone (NMP), hexamethylphosphoramide (HMPA), dimethyl sulfoxide (DMSO), acetonitrile, tetrahydrofuran (THF), 1,4-dioxane, dichloromethane, chloroform, carbon tetrachloride, dichloroethane, acetone, ethyl acetate, pentane, hexane, decalin, dioxane, benzene, toluene, xylene, o-dichlorobenzene, diethyl ether, methyl t-butyl ether, methanol, ethanol, ethylene glycol, isopropanol, propanol, n-butanol, and mixtures thereof. In a preferred embodiment, the solvent is acetone, methanol, ethanol, and/or isopropanol. More preferably the solvent is methanol. In one embodiment, the solvent may comprise water. The water used as a solvent or for other purposes may be tap water, distilled water, bidistilled water, deionized water, deionized distilled water, reverse osmosis water, and/or some other water. In one embodiment, the water is bidistilled or treated with reverse osmosis to eliminate trace metals. Preferably the water is bidistilled, deionized, deion-ized distilled, or reverse osmosis water, and at 25° C. has a conductivity of less than 10 µS·cm⁻¹, preferably less than 1 µS·cm⁻¹; a resistivity of greater than 0.1 MΩ·cm, preferably greater than 1 MΩ·cm, more preferably greater than 10 MΩ·cm; a total solid concentration of less than 5 mg/kg, preferably less than 1 mg/kg; and a total organic carbon concentration of less than 1000 µg/L, preferably less than 200 µg/L, more preferably less than 50 µg/L. In one embodiment, the carrier gas is $N_2$, He, Ar, and/or compressed air. Preferably the carrier gas is $N_2$. Preferably the solvent and the mixture comprising nickel and molybdenum are able to form an appropriately soluble solution that can be dispersed in the carrier gas as aerosol particles. For instance, the mixture comprising nickel and molybdenum may first be dissolved in a volume of solvent, and then pumped through a jet nozzle in order to create an aerosol mist. In other embodiments, the mist may be generated by a piezoelectric ultrasonic generator. Other nebulizers and nebulizer arrangements may also be used, such as concentric nebulizers, cross-flow nebulizers, entrained nebulizers, V-groove nebulizers, parallel path nebulizers, enhanced parallel path nebulizers, flow blurring nebulizers, and piezoelectric vibrating mesh nebulizers.

In one embodiment, the aerosol has a mass concentration M, of 10 µg/m$^3$-1,000 mg/m$^3$, preferably 50 µg/m$^3$-1,000 µg/m$^3$. In one embodiment, the aerosol has a number concentration N, in a range of 10$^3$-10$^6$, preferably 10$^4$-10$^5$ cm$^{-3}$. In other embodiments, the aerosol may have a number concentration of less than 10$^3$ or greater than 10$^6$. The aerosol particles or droplets may have an equivalent volume diameter (de) in a range of 20 nm-100 µm, prefer-ably 0.5-70 µm, more preferably 1-50 µm, though in some embodiments, aerosol particles or droplets may have an average diameter of smaller than 0.2 µm or larger than 100 µm.

In one embodiment, during the contacting of the aerosol, the carrier gas has a flow rate in a range of 20-250 cm$^3$/min, preferably 50-230 cm$^3$/min, more preferably 75-200 cm$^3$/min, even more preferably 100-150 cm$^3$/min, or about 120 cm$^3$/min. Preferably, the aerosol has a flow rate similar to the carrier gas, with the exception of the portion of aerosol that gets deposited on the substrate. In one embodiment, the aerosol may enter the chamber and the flow rate may be stopped, so that a portion of aerosol may settle on the substrate.

The contacting and/or introducing may take place within a closed chamber or reactor, and the aerosol may be generated by dispersing a solution of the mixture comprising nickel and molybdenum and solvent. In one embodiment, this dispersing may be increased by fans, jets, or pumps. However, in another embodiment, an aerosol may be formed in a closed chamber with a substrate where the aerosol particles are allowed to diffuse towards or settle on the substrate. In one embodiment, the closed chamber or reactor may have a length of 10-100 cm, preferably 12-30 cm, and a diameter or width of 1-10 cm, preferably 2-5 cm. In other embodiments, the closed chamber or reactor may have an interior volume of 0.2-100 L, preferably 0.3-25 L, more preferably 0.5-10 L. In one embodiment, the closed chamber or reactor may comprise a cylindrical glass vessel, such as a glass tube.

Being in a closed chamber, the interior pressure of the chamber (and thus the pressure of the aerosol) may be controlled. The pressure may be practically unlimited, but need not be an underpressure or an overpressure. Preferably the chamber and substrate are heated and held at a temperature prior to the contacting, so that the temperature may stabilize. The chamber and substrate may be heated for a time period of 5 min-1 hour, preferably 10-20 min prior to the contacting.

Furthermore, the aerosol-assisted chemical vapor depositing is carried out for from 20 to 360 min, preferably 20 to 330 min, preferably 20 to 300 min, preferably 30 to 250 min, preferably 30 to 220 min, preferably 30 to 200 min at a fixed temperature of 200-1000° C., preferably 300-900° C., preferably 400-800° C., preferably 400-700° C. In yet other embodiments of this invention, the aerosol-assisted chemical vapor depositing is carried out for from 30, 40, 50, 60, 70, 80, 90, 100, 110, 120, 130, 140, 150, 160, 170, 180, and/or 190 to 200 min at a fixed temperature of 400, 430, 460, 490, 510, 540, 570, 600, 630, and/or 660 to 700° C.

The method of making electrocatalyst may further comprise a step of cooling the electrocatalyst after the contacting. The electrocatalyst may be cooled to a temperature between 10 to 45° C., 20 to 40° C., or 25 to 35° C. under an inert gas (such as N$_2$ or Ar) over a time period of 0.5-5 h, 0.75-4 h, 1-3 h, 1.25-2.5 h, or 1.5-2 h. In one embodiment, the electrocatalyst may be left in the chamber and allowed to cool.

In one embodiment, the precursors are Ni(acac)$_2$ and MoO$_2$(acac)$_2$. In one embodiment, the electrocatalyst has a crystalline single phase NiMoO$_4$ nanoflowers.

In one embodiment, the electrocatalyst have a surface of vertically aligned nanosheets assembled into the NiMoO$_4$ nanoflowers.

In some embodiments, the nanoflowers described herein may be called "microflowers".

In one embodiment, the nanoflowers disclosed herein is substantially free of dopants, which includes being substantially free of, preferably less than 1.0%, 0.1%, 0.01% or 0.001%, or completely free of (i.e., 0 wt. %) dopants. Exemplary dopants include, but are not limited to, zinc, lithium, and vanadium.

The electrocatalyst may comprise NiMoO$_4$ in the form of an amorphous phase, a crystalline phase, or both. In one embodiment, the electrocatalyst consists essentially of crystalline NiMoO$_4$, meaning that the NiMoO$_4$ comprises at least 99 wt %, preferably 99.9 wt %, more preferably 99.95 wt % NiMoO$_4$ in a crystalline state, relative to a total weight of the NiMoO$_4$.

The nanoflowers are randomly arranged on the surface of the substrate.

The substrate may be of any desirable shape, such as, a circle, a triangle, a rectangle, a pentagon, a hexagon, an irregular polygon, a circle, an oval, an ellipse, or a multilobe. Preferably, the substrate is rectangular in shape with a length and width of 0.5-5 cm, 1-4 cm, or 2-3 cm, respectively. The substrate may have an area in a range of 0.25-25 cm$^2$, preferably 0.5-5 cm$^2$, more preferably about 2 cm$^2$.

The nanoflowers deposited on the substrate may have an average thickness in a range of 0.5-5 µm, preferably 0.7-4 µm, more preferably 0.8-3 µm, even more preferably 0.9-2 µm, or about 1 µm. In one embodiment, the thickness of the nanoflowers may vary from location to location on the substrate by 1-30%, 5-20%, or 8-10% relative to the average thickness of the nanoflowers deposited on the substrate. In a preferred embodiment, 70-100%, more preferably 80-99%, even more preferably 85-97% of the surface of the substrate is covered with the nanoflowers, though in some embodiments, less than 70% of the surface of the substrate is covered with the nanoflowers.

In one embodiment, the NiMoO$_4$ nanoflowers have a crystalline single phase by XRD and XPS. In one embodiment, the nanoflowers are in a form of irregularly aggregated nanoflakes.

In one embodiment, the NiMoO$_4$ nanoflowers after 20 to 150 minutes, preferably 30 to 130 minutes, preferably 40 to 90 minutes of the aerosol-assisted chemical vapor depositing have a Tafel value of 20 to 160 mV dec$^{-1}$, preferably 30 to 140 mV dec$^{-1}$, preferably 50 to 100 mV dec$^{-1}$.

In one embodiment, the NiMoO$_4$ nanoflowers after 40, 45, 50, 55, 60, 65, 70, 75, 80 and/or 85 to 90 minutes of the aerosol-assisted chemical vapor depositing have a Tafel value of 50, 55, 60, 65, 70, 75, 80, 85, 90, and/or 50 to 160 mV dec$^{-1}$, preferably 60 to 150 mV dec$^{-1}$, preferably 70 to 130 mV dec$^{-1}$, preferably 95 to 100 mV dec$^{-1}$.

In one embodiment, the electrocatalyst has a constant current density after 5 to 30 hours, preferably 8 to 25 hours, preferably 10 to 20 hours with 5-30 mA cm$^{-2}$, preferably 7-20 mA cm$^{-2}$, preferably 7-15 mA cm$^{-2}$.

In one embodiment, the electrocatalyst has a constant current density after 10, 11, 12, 13, 14, 15, 16, 17, 18 and/or 19 to 20 hours with 7, 8, 9, 10, 11, 12, 13 and/or 14 to 15 mA cm$^{-2}$.

In one embodiment, the process further comprising contacting the electrocatalyst with an aqueous electrolyte solution having a pH of 8 to 14; and applying a potential of 1.20 to 1.90 V, preferably 1.25 to 1.85 V, preferably 1.30 to 1.80 V, preferably 1.30 to 1.70 V to the electrocatalyst and a counter electrode immersed in the aqueous electrolyte solution.

In one embodiment, the process further comprising contacting the electrocatalyst with an aqueous electrolyte solution having a pH of 8, 8.5, 9, 9.5, 10, 10.5, 11, 11.5, 12, 12.5, 13 and/or 13.5 to 14; and applying a potential of 1.30, 1.35, 1.40, 1.45, 1.50, 1.55, 1.60 and/or 1.65 to 1.70 V to the electrocatalyst and a counter electrode immersed in the aqueous electrolyte solution.

FIG. 1 shows the X-Ray Diffraction (XRD) patterns of single phased $NiMoO_4$ samples prepared for 60 and 120 min via aerosol-assisted chemical vapor deposition (AACVD). Both XRD patterns exhibited good crystallinity as evident from several small and long intensity peaks shown in FIG. 1. The peaks are labelled with their corresponding reflections from which they are produced. The XRD fingerprints for NM1 and NM2 look similar in terms of peak positions and suggest the crystallographic analogy of the product synthesized in the two samples. The crystalline peaks at 2θ values of 20-25°, preferably 21-24°, preferably 22-24°, preferably 23.6°, 25-26.5°, preferably 26.2°, 25-26.7°, preferably 25.5-26.7°, preferably 26.7°, 26.6-27.3°, preferably 26.6-27.1°, preferably 26.8°, 27.3-28.1°, preferably 27.3-27.9°, preferably 27.3-27.6°, preferably 27.4°, 27.4-31.5°, preferably 27.5-30°, preferably 27.7-29°, preferably 28.8°, 29-33°, preferably 30-33°, preferably 30-32.8°, preferably 31-32.6°, preferably 32.5°, 33-37.0°, preferably 33-36.0°, preferably 33-35.0°, preferably 33-34°, preferably 33.9°, 34-39°, preferably 35-38°, preferably 36-38°, preferably 37.2°, 35-40°, preferably 36-40°, preferably 37-40°, preferably 38-40°, preferably 39.3°, 40-41.9°, preferably 40-41.5°, preferably 40-41.0°, preferably 40-40.8°, preferably 40.6°, 40-44°, preferably 41-43°, preferably 42.0°, 42-47°, preferably 43-46°, preferably 44.2°, 44-52°, preferably 45-50°, preferably 46-49°, preferably 46-48°, preferably 47.4°, 50-54°, preferably 51-53°, preferably 52-53°, preferably 52.3°, 53-59°, preferably 53-58°, preferably 53-57°, preferably 53-56°, preferably 53-55°, preferably 54.2°, 55-62°, preferably 56-61°, preferably 58-61°, preferably 60.7°, 60-64°, preferably 61-63°, preferably 62-63°, preferably 62.3°, 62-78°, preferably 63-75°, preferably 63-70°, preferably 63-65°, preferably 64.8° and 75-80°, preferably 76-89°, preferably 78.4° are indexed to the reflections (02-1), (201), (002), (220), (11-2), (31-1), (112), (31-2), (400), (040), (330), (222), (33-2), (241), (20-4), (53-1), (42-4), (44-3), (333) and (82-2) respectively, and match with the crystallographic data of single phase Nickel Molybdenum Oxide "$NiMoO_4$" in monoclinic crystal system (ICSD No. 00-045-0142). No other crystalline nickel or molybdenum oxide phases are identified from XRD patterns as impurity. In both XRD patterns the dominant, 100% intensity peak is situated at 2θ 23 to 30°, preferably 25 to 29°, preferably 25 to 28°, preferably 26.8°.

Figure 2:
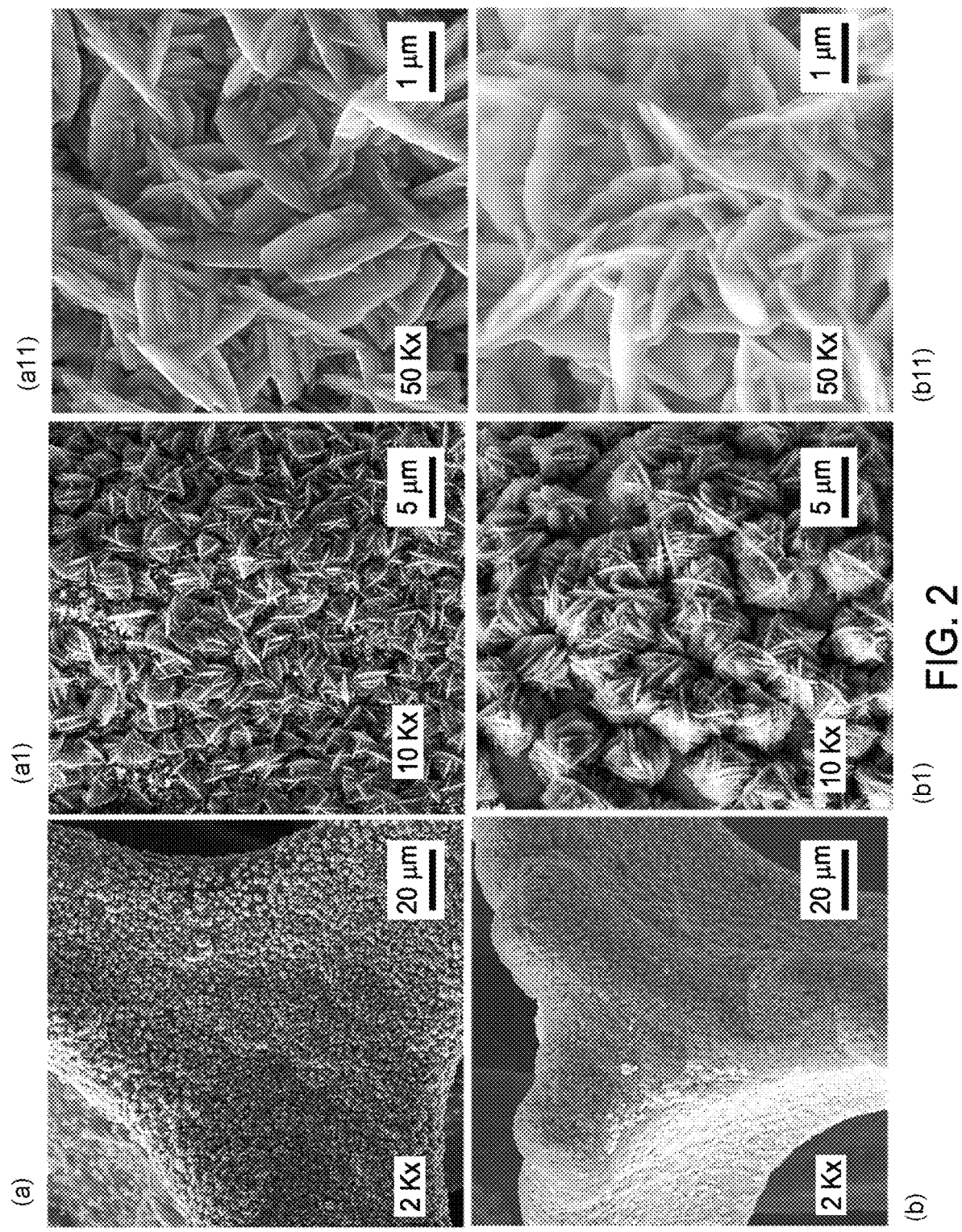
FIG. 2 shows Field Emission Scanning Electron Microscope (FESEM) images of NM1 (a) and NM2 (b). Low resolution images ((a) and (b)); High resolution (10 Kx) images ((a1) and (b1)) and (50 Kx) images ((a11) and (b11)).

The surface morphology of the fabricated films developed after 30 to 200 min, preferably 40 to 150 min, preferably 50-130 min, preferably 60 and 120 min deposition time on nickel foam (NF), were discerned by Field Emission Scanning Electron Microscope (FESEM) analysis and the observed micrographs are displayed in FIG. 2. Low resolution images, FIG. 2 (a), (b) indicate that the NF strut is wreathed with a layer of crystallites. The enlarged images shown in FIG. 2 (a1), (b1) display several intertwined close packed spherical objects which flourished into blooming flower like patterns. Further insight to these structures reveals that the intertwined patterns are comprised of large number of vertically arranged cross-linked nano-sheet like petals with clear grain boundaries in sample NM1 (FIG. 2 (a11)). These petal-like features were wilted when the deposition time was increased to 100 to 150 min, preferably 120 min (NM2) due to the extended sintering process (FIG. 2 (b11)). These hierarchical flower-like structures comprising 2D-nano-sheets play significant role in various electrochemical based devices such as supercapacitor, dye sensitized solar cell, hydrogen storage and water splitting studies. The hierarchical petal networks on 3D NF present high surface area and provide effective contact between the catalyst material and electrolyte ions. Therefore, it is expected that the $NiMoO_4$ petals obtained after 30 to 90 min, preferably 40 to 80 min, preferably 60 min of deposition time (NM1) are comprised of greater number of interfacial and electrocatalytic active sites that could lead to the enhanced OER performance.

Figure 3A:
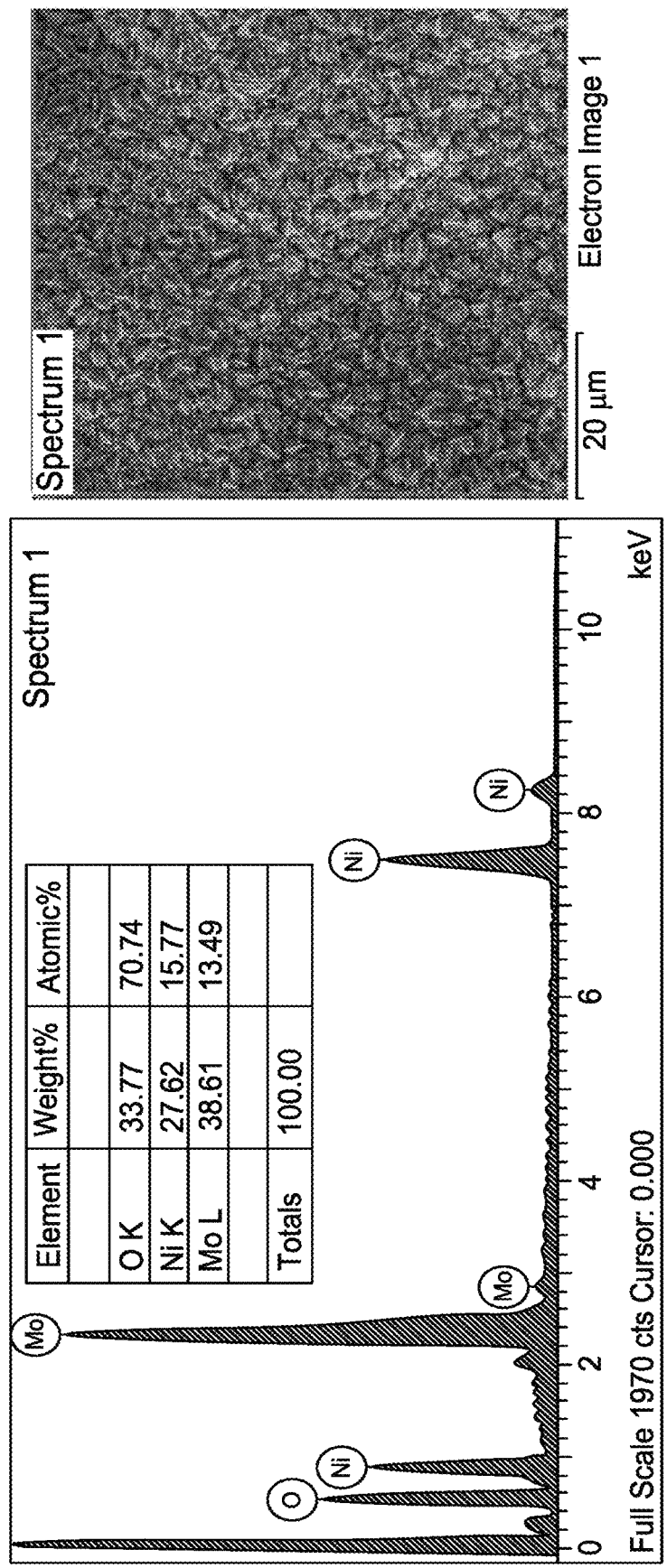
FIG. 3A displays Energy Dispersive X-ray (EDX) spectra of NiMoO$_4$ films NM1.
Figure 3B:
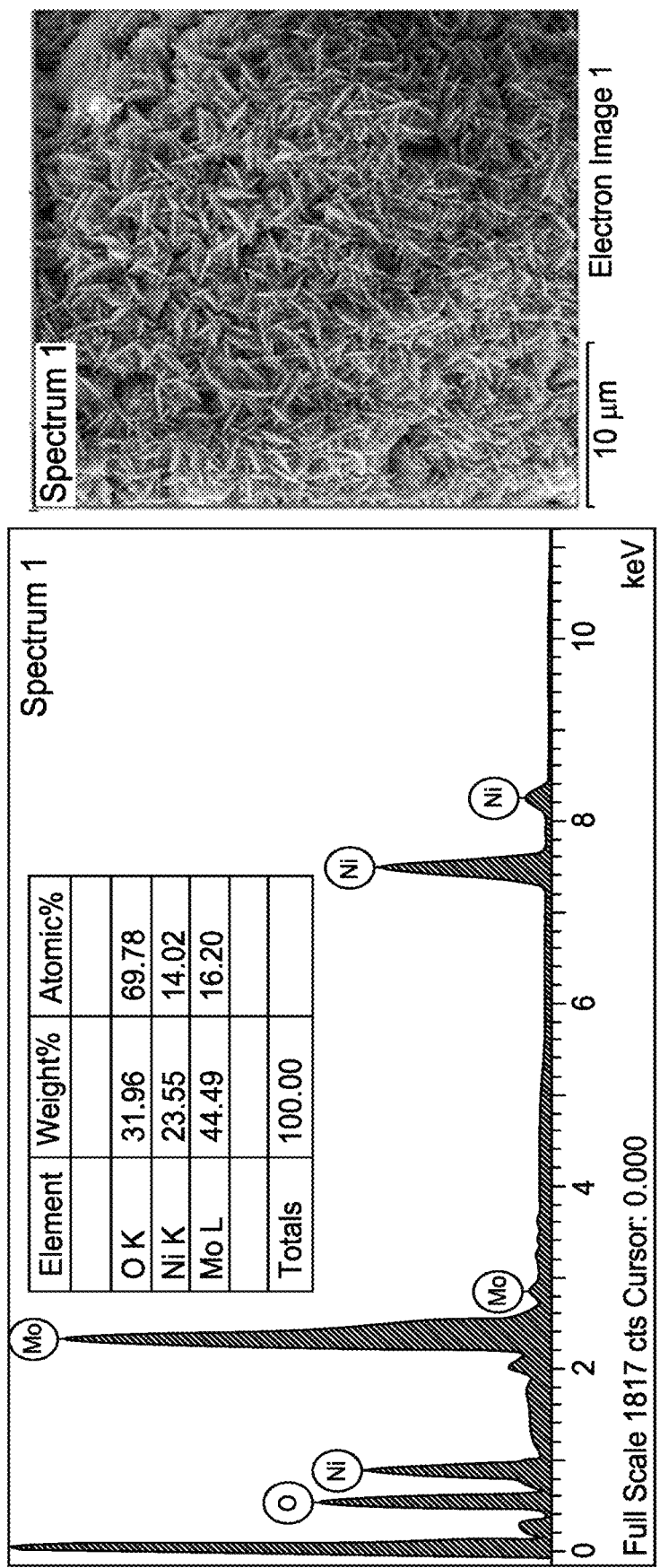
FIG. 3B displays Energy Dispersive X-ray (EDX) spectra of NiMoO$_4$ films NM2.
Figure 4:
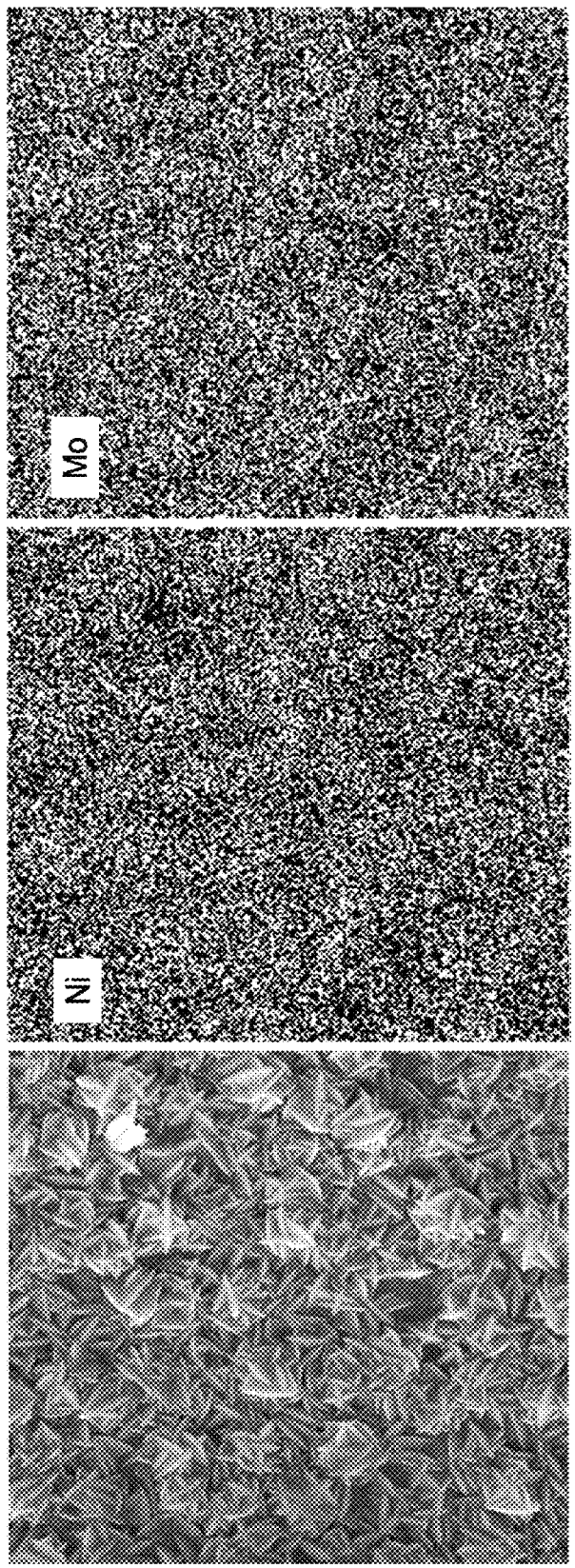
FIG. 4 shows Energy Dispersive X-ray (EDX) elemental map analysis of NM1.

The atomic composition in $NiMoO_4$ films was determined by energy dispersive X-ray analysis (EDX). As the films were grown on NF substrates, it was expected to have higher Ni concentration due to the contribution from NF substrates, therefore, the atomic concentration was measured from the analogous film samples grown on plane glass substrates. FIG. 3 displays the EDX patterns of $NiMoO_4$ film samples with measured % atomic concentration of Ni and Mo atoms which empirically exist in 1 to 1 mole ratio. The elemental map analysis (FIG. 4) shows the atomic dispersion of Ni and Mo depicting a uniform and even distribution of both elements on the film surface.

Figure 5A:
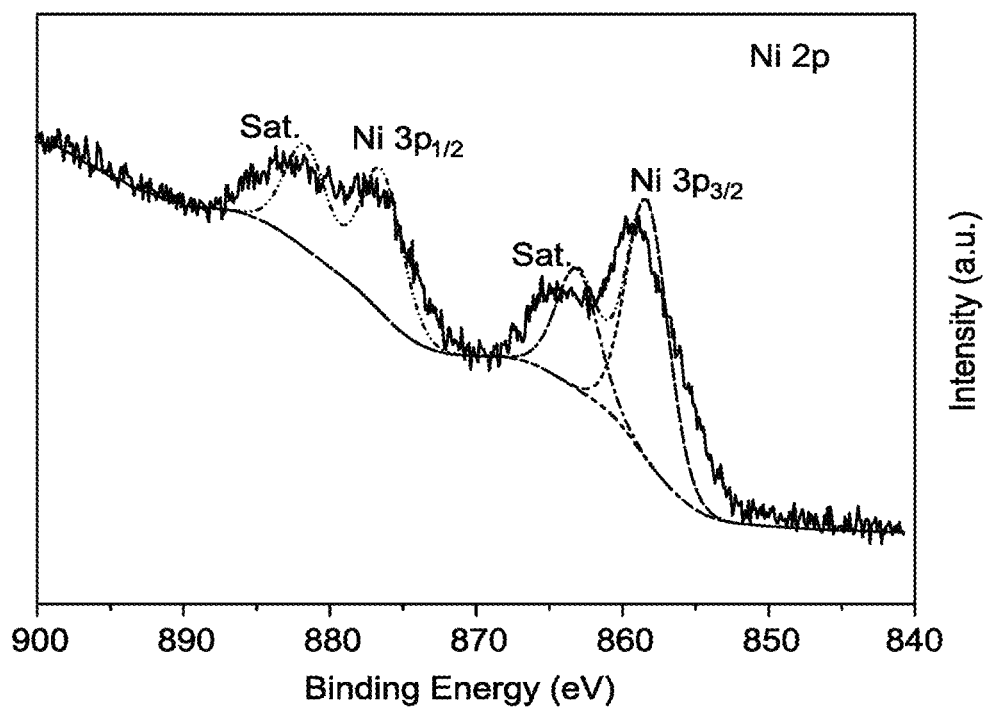
FIG. 5A shows high resolution XPS spectrum of NM1 (Ni 2p).
Figure 5B:
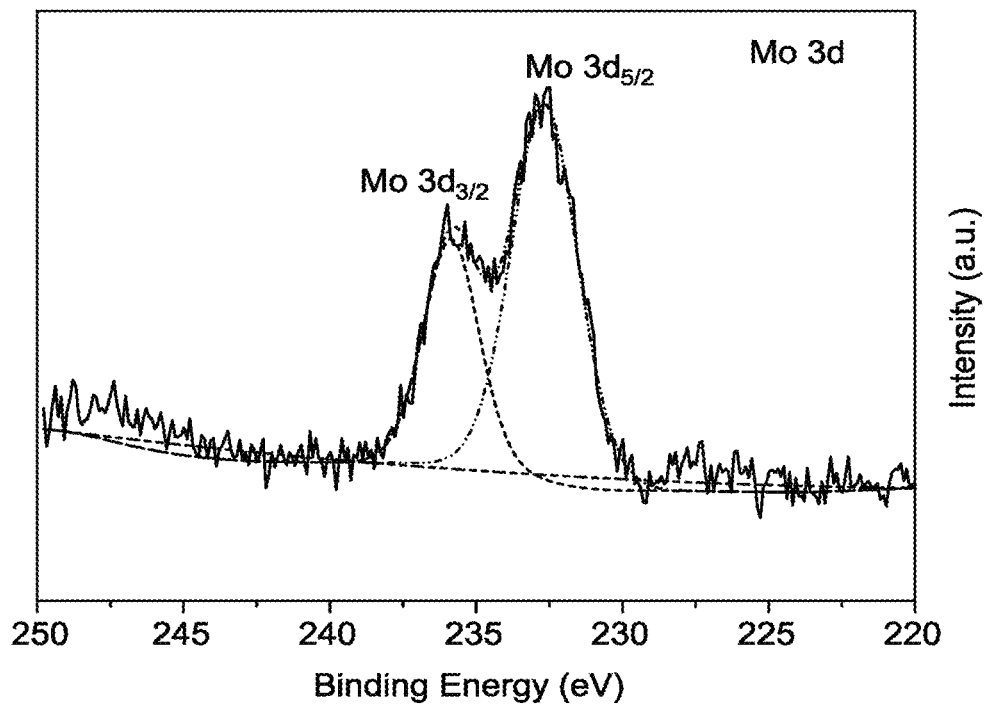
FIG. 5B shows high resolution XPS spectrum of NM1 (Mo 3d).
Figure 5C:
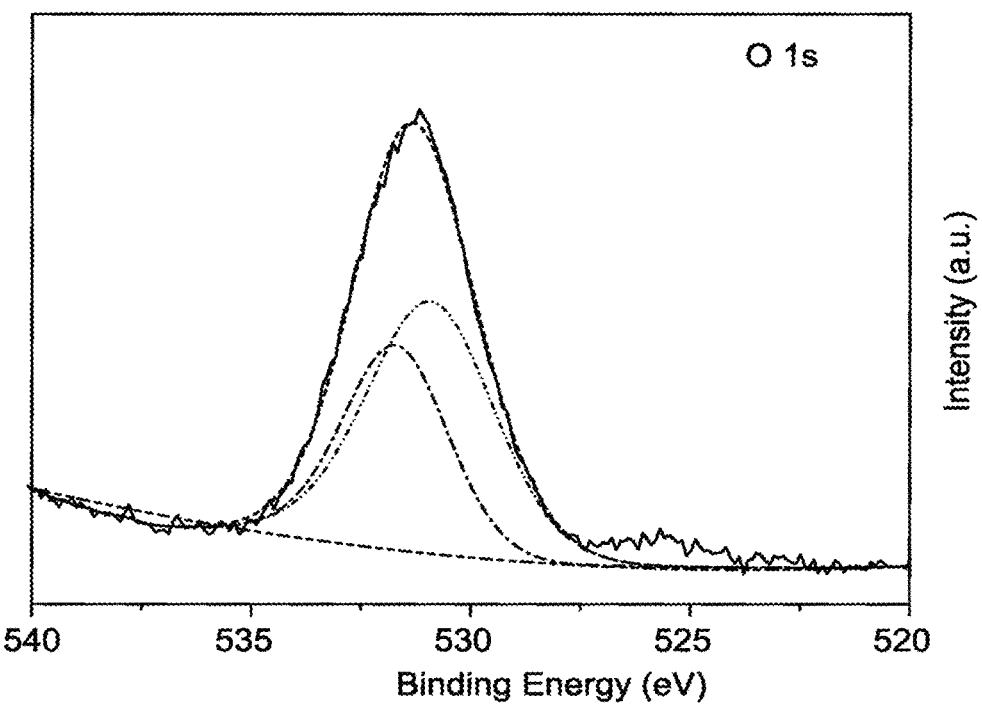
FIG. 5C shows high resolution XPS spectrum of NM1 (O 1s).

The chemical behavior and oxidation state of the elements involved in $NiMoO_4$ film (NM1) was investigated by X-ray photoelectron spectroscopy (XPS). FIG. 5 indicates the high resolution XPS spectrum of constituent Ni, Mo and O elements. The Ni 2p spectrum involves two major peaks related to Ni $2p_{3/2}$ and Ni $2p_{1/2}$ spin orbitals at binding energy value 858 and 876 eV respectively as disclosed by Hong et al. in Rational Construction of Three-Dimensional Hybrid $Co_3O_4$@$NiMoO_4$ Nanosheets Array for Energy Storage Application, J. Power Sources 2014, 270, 516-525; the entire disclosure is incorporated herein by reference. The corresponding satellites peaks appeared at 850 to 870 eV, preferably 863 and 870 to 900 eV, preferably 883 eV. This electronic structure signifies the existence of $Ni^{2+}$ oxidation in $NiMoO_4$. The Mo 5d spectrum exhibits a doublet peak of binding energies located at 220 to 235 eV, preferably 232.5 eV and 233 to 240 eV, preferably 235.6 attributed with $Mo3d_{5/2}$ and $Mo\ 3d_{3/2}$, respectively as disclosed by Hussain et al. in Continuous and High Electrical Performances of Bilayer to Few Layers $MoS_2$ Fabricated by RF Sputtering via Post-Deposition Annealing Method. Sci. Reports 2016 61, 2016, 6 (1), 1-13; the entire disclosure is incorporated herein by reference. The difference in binding energy ($\Delta E$) of about 3.1 eV is the typical for $Mo^{6+}$ oxidation state in $NiMoO_4$ as disclosed by Blomberg et al. in Bimetallic Nanoparticles as a Model System for an Industrial NiMo Catalyst. Materials (Basel), 2019, 12 (22); the entire disclosure is incorporated herein by reference. The symmetrical O1s spectrum shows two peaks at binding energy of 520 to 531 eV, preferably 531 and 532 to 540 eV, preferably 531.7 eV, characteristic of metal oxygen bonds in $NiMoO_4$ as disclosed by Wang et al. in Hierarchical $NiMoO_4$ Nanowire Arrays Supported on Macroporous Graphene Foam as Binder-Free 3D Anodes for High-Performance Lithium Storage, Phys. Chem. Chem. Phys. 2015, 18 (2), 908-915; the entire disclosure is incorporated herein by reference. The XPS observations are comparable with the previous reports on NiMoO$_4$ materials. The XPS results confirm that oxidation states of Ni, Mo and O elements is +2, +6 and −2, respectively which agrees well with the chemical formula NiMoO$_4$ identified from XRD data.

Electrochemical Water Oxidation on NiMoO$_4$ Nanosheets

The well-formed crystalline, hierarchical and porous nanostructures on NF can maximize the effective mass transport and boost the electrocatalytic performance as disclosed by Aminu et al. in Multifunctional Mo—N/C@MoS$_2$ Electrocatalysts for HER, OER, ORR, and Zn-Air Batteries, Adv. Funct. Mater. 2017, 27 (44), 1702300; the entire disclosure is incorporated herein by reference. The NM1 and NM2 containing NiMoO$_4$ nanosheets were investigated for their electrocatalytic efficiency by studying the Oxygen Evolution Reaction (OER) in alkaline media. The surface of the electrodes deposited with NiMoO$_4$ nanosheets were electrochemically activated employing cyclic voltammetry (CV). The electrodes were scanned for 30 to 60 consecutive cycles, preferably 40 to 60 consecutive cycles, preferably 50 consecutive cycles at a scan rate of 30 to 60 mV s$^{-1}$, preferably 40 to 60 mV s$^{-1}$, preferably 50 mV s$^{-1}$. The peaks indicative of strong reversible redox reactions between Ni$^{2+}$/Ni$^{3+}$ or NiO/NiOOH were observed in both samples. The oxidative peaks for Ni oxidation (Ni$^{+2}$ to Ni$^{+3}$) appeared between 1.3-1.5 V vs Reference Hydrogen Electrode (RHE) implying a favorable electrochemical activity for oxidation reactions as disclosed by Jothi et al. in Enhanced Methanol Electro-Oxidation over in-Situ Carbon and Graphene Supported One Dimensional NiMoO$_4$ Nanorods, J. Power Sources 2015, 277, 350-359; the entire disclosure is incorporated herein by reference. The voltammograms showed that the intensity of redox peaks increased with increasing the number of cyclic scans. It could be inferred that the greater number of NiOOH active sites were generated due to increased Ni$^{+2}$ oxidation with each cycle. The increase in catalytic sites resulted in improved overpotential and the current density of the catalyst.

Figure 6A:
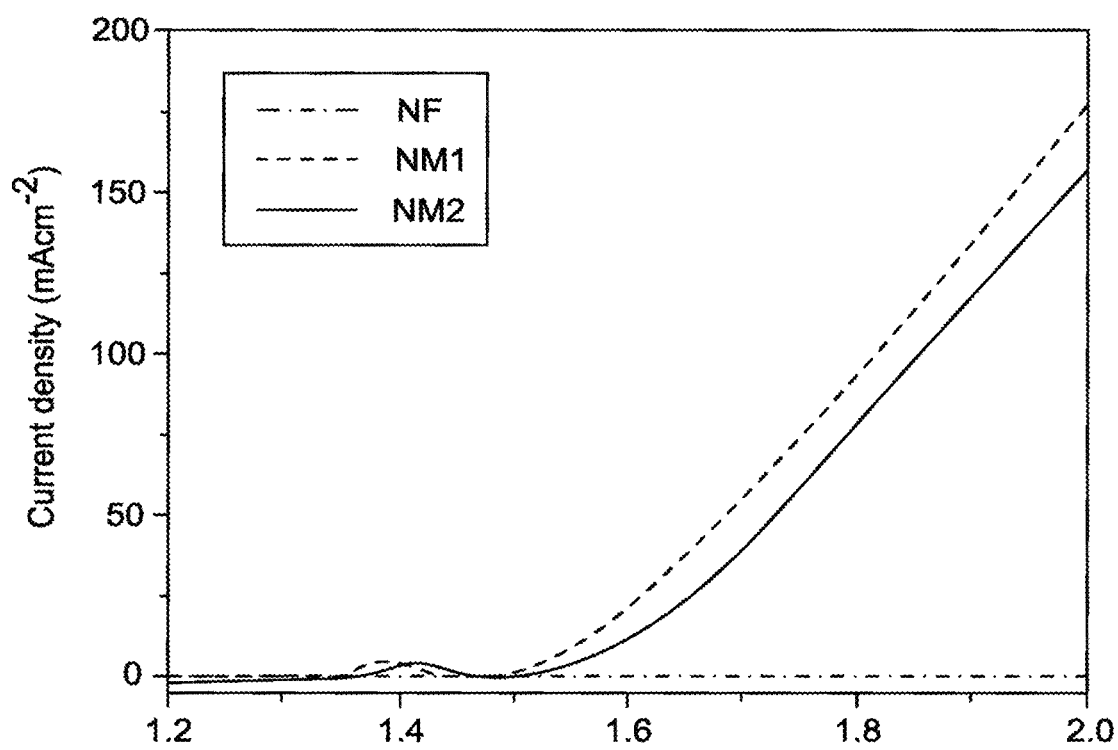
FIG. 6A shows electrochemical characterization of NiMoO$_4$ electrocatalysts compared to the NF substrate (polarization curves (LSVs) obtained at a scan rate of 10 mVsec$^{-1}$).
Figure 6B:
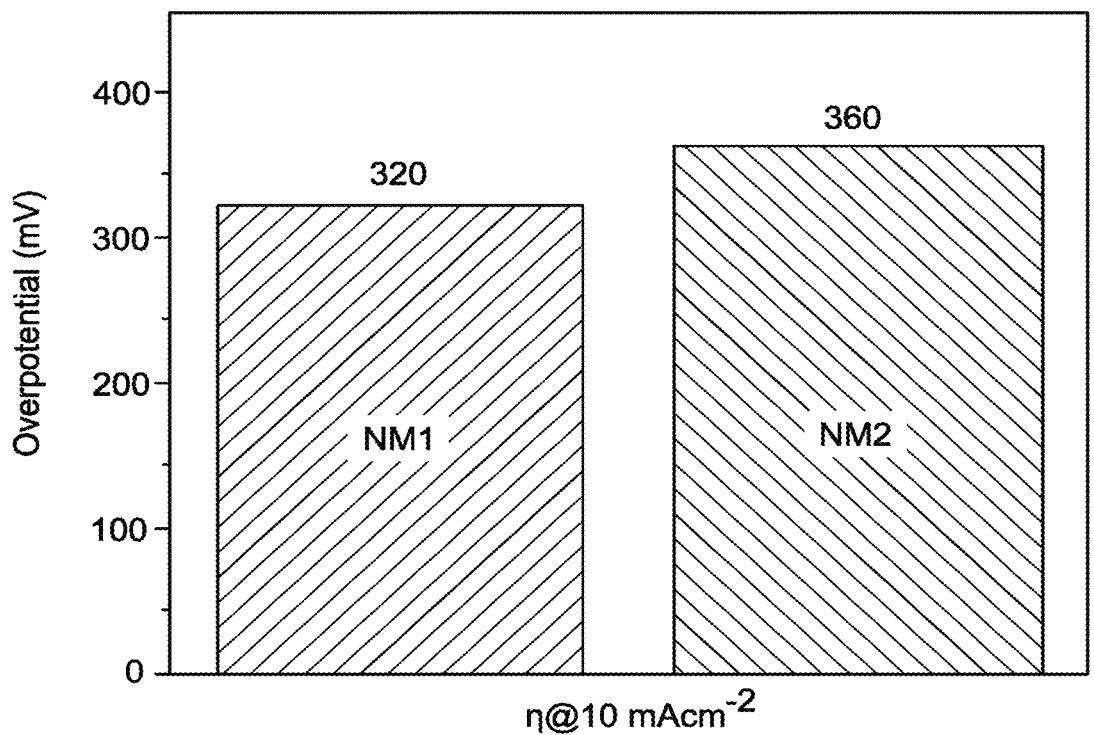
FIG. 6B shows electrochemical characterization of NiMoO$_4$ electrocatalysts compared to NF substrate (comparison of overpotential values of NiMoO$_4$ catalyst to reach benchmark current densities of 10 mA cm$^{-2}$).

The linear sweep voltammetry (LSV) was performed under static condition to measure the OER activity of NiMoO$_4$ nanosheets. The LSV curves are displayed in FIG. 6. Both the electrodes i.e., NM1 and NM2 demonstrated a higher current density and lower overpotentials as compared to the bare NF (FIG. 6a). A final current density of about 170 to 185 mAcm$^{-2}$, preferably 178 mAcm$^{-2}$ was attained at a potential ~2.0 V (Vs RHE) with NM1 whereas NM2 showed a current density of about 150 to 168 mAcm$^{-2}$, preferably 158 mAcm$^{-2}$. Moreover, electrode NM1 showed an improved overpotential as compared to that obtained after 80 to 200 min, preferably 100 to 150 min, preferably 120 min. To deliver a current density of 5 to 20 mA cm$^{-2}$, preferably 5 to 15 mA cm$^{-2}$, preferably 10 mA cm$^{-2}$, the overpotential required was 200 to 400 mV, preferably 250 to 350 mV, preferably 320 mV by NM1 whereas NM2 displayed a relatively high onset potential and required 340 to 400 mV, preferably 360 mV to achieve the current density of 5 to 15 mA cm$^{-2}$, preferably 10 mA cm$^{-2}$ (FIG. 6b). This indicates that a better OER could be achieved by employing deposition time of 0.5 to 3 h, preferably 1 h. The decrease in performance of NM2 could be attributed to the crumbling of petal like microstructure (FIG. 2 (b11)) which might have lost the catalytic active sites to decrease its OER performance.

Figure 6C:
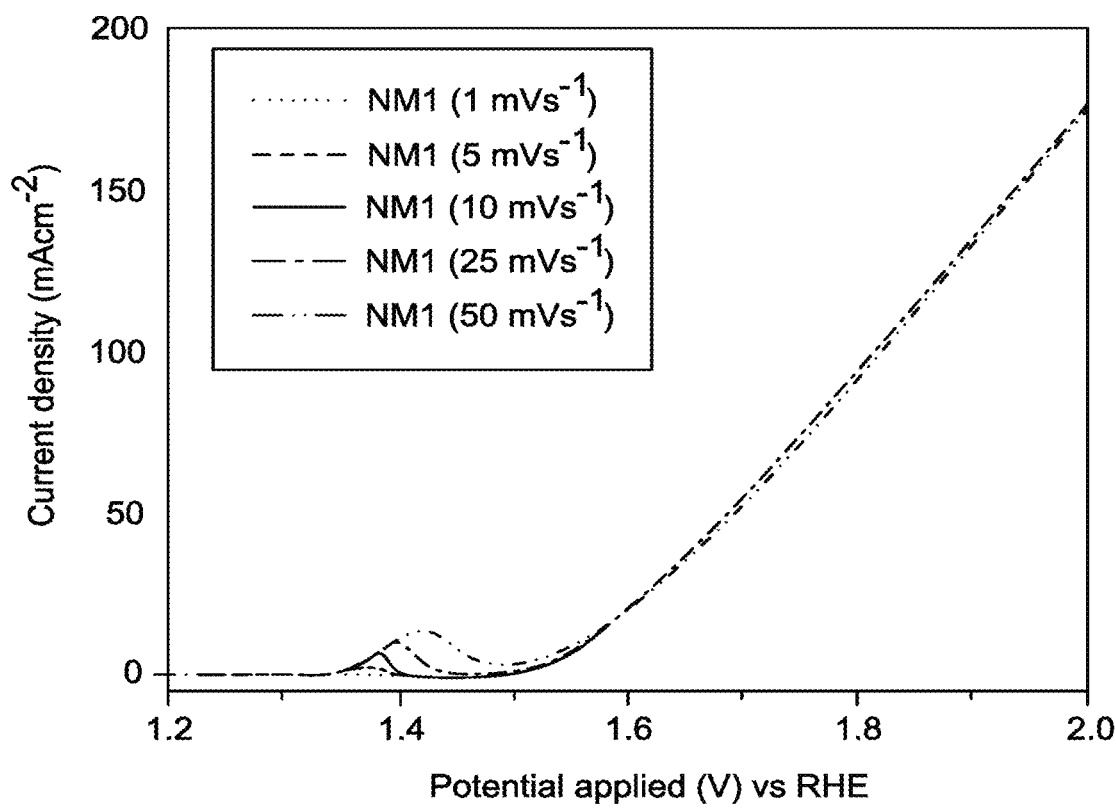
FIG. 6C shows electrochemical characterization of NiMoO$_4$ electrocatalysts compared to NF substrate (polarization curves of best OER activity of NiMoO$_4$ catalyst recorded at different scan rates of 1, 5, 10, 25 and 50 mV sec$^{-1}$).
Figure 6D:
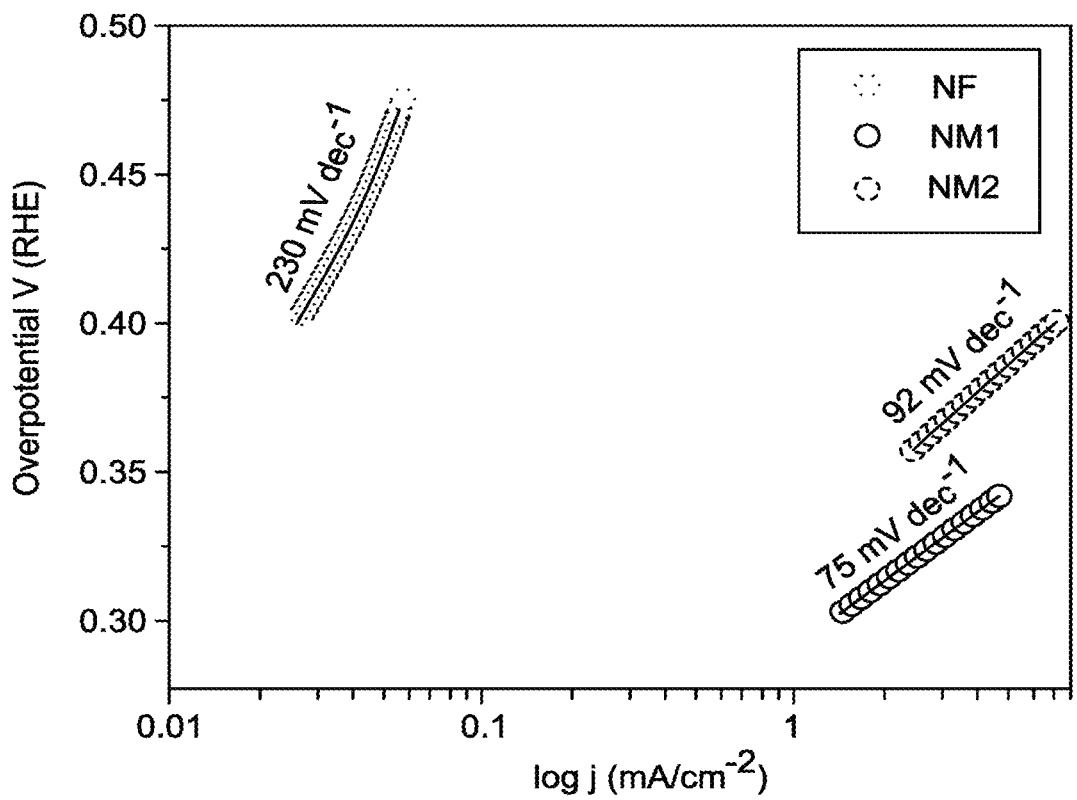
FIG. 6D shows electrochemical characterization of NiMoO$_4$ electrocatalysts compared to NF substrate (tafel plot indicating the OER kinetics for NiMoO$_4$ catalysts).

The effect of scan rate on the electrocatalytic efficiency of NM1 for OER was investigated by varying the scan rates (5, 10, 25, 50 and 100 mV s$^{-1}$) in LSV as shown in FIG. 6c. It is clear from the results that the oxidation peak shifted towards higher potential with an increase in the scan rate suggesting a diffusion-controlled charge-transfer mechanism with no obvious change in final current density as disclosed by Shombe et al. in Shombe, G. B.; Khan, M. D.; Alenad, A. M.; Choi, J.; Ingsel, T.; Gupta, R. K.; Revaprasadu, N. Unusual Doping Induced Phase Transitions in NiS via Solventless Synthesis Enabling Superior Bifunctional Electrocatalytic Activity, Sustain. Energy Fuels 2020, 4 (10), 5132-5143; the entire disclosure is incorporated herein by reference. The internal diffusion resistance within the active material increased leading to shift in redox peaks with increasing scan rate as disclosed by Yin et al. in Hierarchical Nanosheet-Based CoMoO$_4$—NiMoO$_4$ Nanotubes for Applications in Asymmetric Supercapacitors and the Oxygen Evolution Reaction, J. Mater. Chem. A 2015, 3 (45), 22750-22758; the entire disclosure is incorporated herein by reference. Moreover, the intensities of the redox peaks changed and an increase in the current density of redox peak was observed upon increasing the scan rate. This is indicative of surface controlled electrochemical process, i.e., the kinetics of the interface faradic redox reactions as disclosed by Yin et al. in Hierarchical Nanosheet-Based CoMoO$_4$—NiMoO$_4$ Nanotubes for Applications in Asymmetric Supercapacitors and the Oxygen Evolution Reaction, J. Mater. Chem. A 2015, 3 (45), 22750-22758; the entire disclosure is incorporated herein by reference.

To gain further insights into the OER kinetics, Tafel slopes were derived by fitting the linear part of the polarization curves for all the electrodes. Generally, a lower value of Tafel slope signifies superior catalytic activity as disclosed by Galani et al. in Development of RuO$_2$/CeO$_2$ Heterostructure as an Efficient OER Electrocatalyst for Alkaline Water Splitting, Int. J. Hydrogen Energy 2020, 45 (37), 18635-18644; the entire disclosure is incorporated herein by reference. The Tafel slope of NM1 was estimated to be 75 mV dec$^{-1}$, much lower than that of NM2 (92 mV dec$^{-1}$) and the bare NF (230 mV dec$^{-1}$), confirming a faster OER kinetics on NM1. The improved electrocatalytic performance of NM1 could be attributed to the high surface area and the effective interfacial contact between the electrocatalyst and the electrolyte. The homogeneous mesoporous structure formed due to the growth of 2D nanosheet petals on the NF provided greater number of active sites leading to the enhanced OER performance as disclosed by Sahu et al. in Metal-Organic Framework (MOF) Derived Flower-Shaped CoSe$_2$ Nanoplates as a Superior Bifunctional Electrocatalyst for Both Oxygen and Hydrogen Evolution Reactions, Sustain. Energy Fuels 2021; the entire disclosure incorporated herein by reference.

The electrocatalytic OER performance of the synthesized NiMoO$_4$ nanosheets on NF by AACVD was compared with benchmark OER catalysts. The OER performance at a current density 10 mAcm$^{-2}$, overpotential along with stability of the catalysts are presented in Table 1. The of NiMoO$_4$ catalyst prepared by AACVD is better than benchmark OER catalysts mentioned in Table 1.

TABLE 1

Comparison of OER parameters of NiMoO$_4$ catalysts with benchmark OER catalysts

| Electro-catalyst | Synthesis method | Overpotential (mV) @ 10 mA cm$^{-2}$ | Electrolyte | Reference given below incorporated herein |
|---|---|---|---|---|
| IrO$_2$ | Commercial | 301 | 1M KOH | Comp. Ex. 1* |
| RuO$_2$ | Commercial | 322 | 1M KOH | Comp. Ex. 2** |

TABLE 1-continued

Comparison of OER parameters of NiMoO$_4$ catalysts with benchmark OER catalysts

| Electro-catalyst | Synthesis method | Over-potential (mV) @ 10 mA cm$^{-2}$ | Electrolyte | Reference given below incorporated herein |
|---|---|---|---|---|
| NiMoO$_4$ | hydrothermal | 340 | 1M KOH | Comp. Ex. 3 *** |
| NiMoO$_4$ | Thermal route | 410 | 1M KOH | Comp. Ex. 4 **** |
| NiMoO$_4$ | AACVD | 320 | 1M KOH | This invention |

*Luo, F.; Zhang, Q.; Yu, X.; Xiao, S.; Ling, Y.; Hu, H.; Guo, L.; Yang, Z.; Huang, L.; Cai, W.; Cheng, H. Palladium Phosphide as a Stable and Efficient Electrocatalyst for Overall Water Splitting, Angew. Chemie Int. Ed. 2018, 57 (45), 14862-14867.
** Hyun, S.; Shanmugam, S. Hierarchical Nickel-Cobalt Dichalcogenide Nanostructure as an Efficient Electrocatalyst for Oxygen Evolution Reaction and a Zn-Air Battery, ACS Omega 2018, 3 (8), 8621-8630.
*** Zhao, X.; Meng, J.; Yan, Z.; Cheng, F.; Chen, J. Nanostructured NiMoO4 as Active Electrocatalyst for Oxygen Evolution, Chinese Chem. Lett. 2019, 30 (2), 319-323.
**** Zhang, S.; She, G.; Li, S.; Qu, F.; Mu, L.; Shi, E. Enhancing the Electrocatalytic Activity of NiMoO4 through a Post-Phosphorization Process for Oxygen Evolution Reaction, Catal. Commun. 2019, 129, 105725.

Figure 7A:
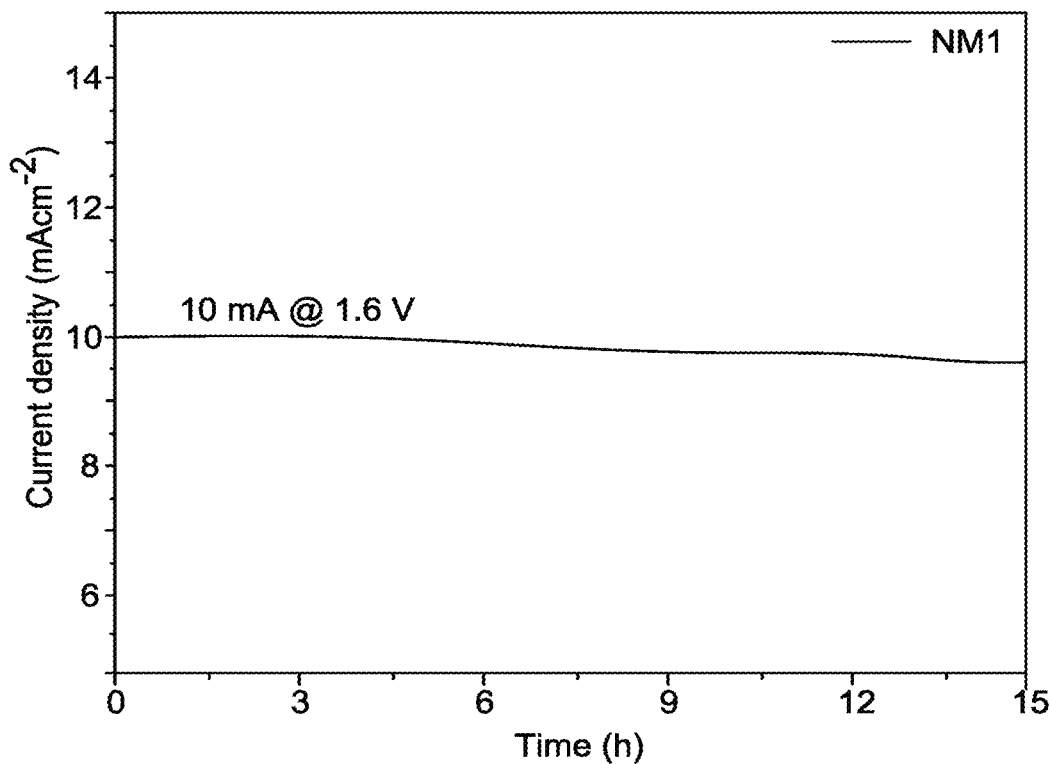
FIG. 7A shows chronoamperometric response measured at an applied fixed potential of 1.6 V.
Figure 7B:
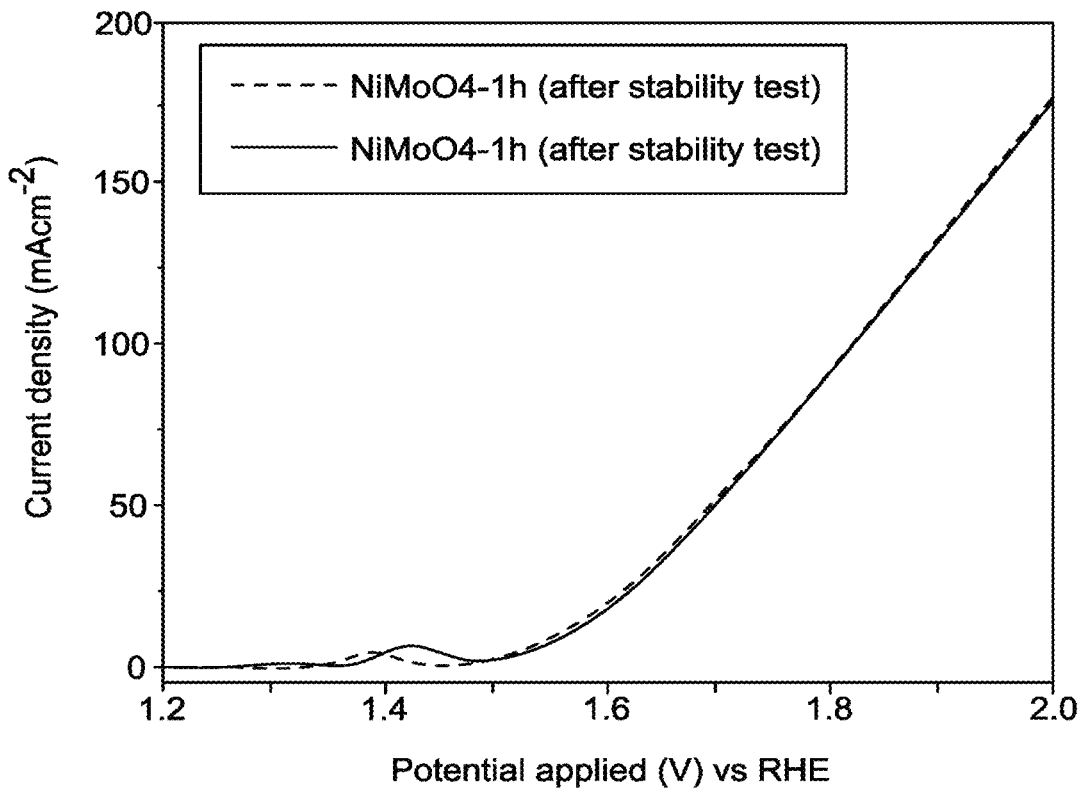
FIG. 7B shows LSV polarization curves before and after stability tests.

To determine feasibility of their practical application, and to test electrochemical stability of the developed electrodes, the long-term electrochemical stability of the developed electrode NMT was investigated by employing chronoamperometry in 0.5 to 2 M, preferably 1 M KOH solution. The chronoamperometric test was performed by applying potential of 1.57 V (Vs RHE) and the current density was monitored for a period of 10-20 h, preferably 15 h as shown in FIG. 7a. The catalyst displayed a constant and steady current for the investigated period and the measured current density after 10-20 h, preferably 15 h was 8 to 11 mA cm$^{-2}$, preferably 9.7 mA cm$^{-2}$ i.e., a drop of only 1-10%, preferably 1-5%, preferably 3% was observed. After the long-term stability test, polarization curve for used NMT was recorded and compared with its fresh form as indicated in FIG. 7b. Both polarization curves are almost identical suggesting the stable OER performance of the NMT electrode even after long term electrochemical studies.

Figure 7C:
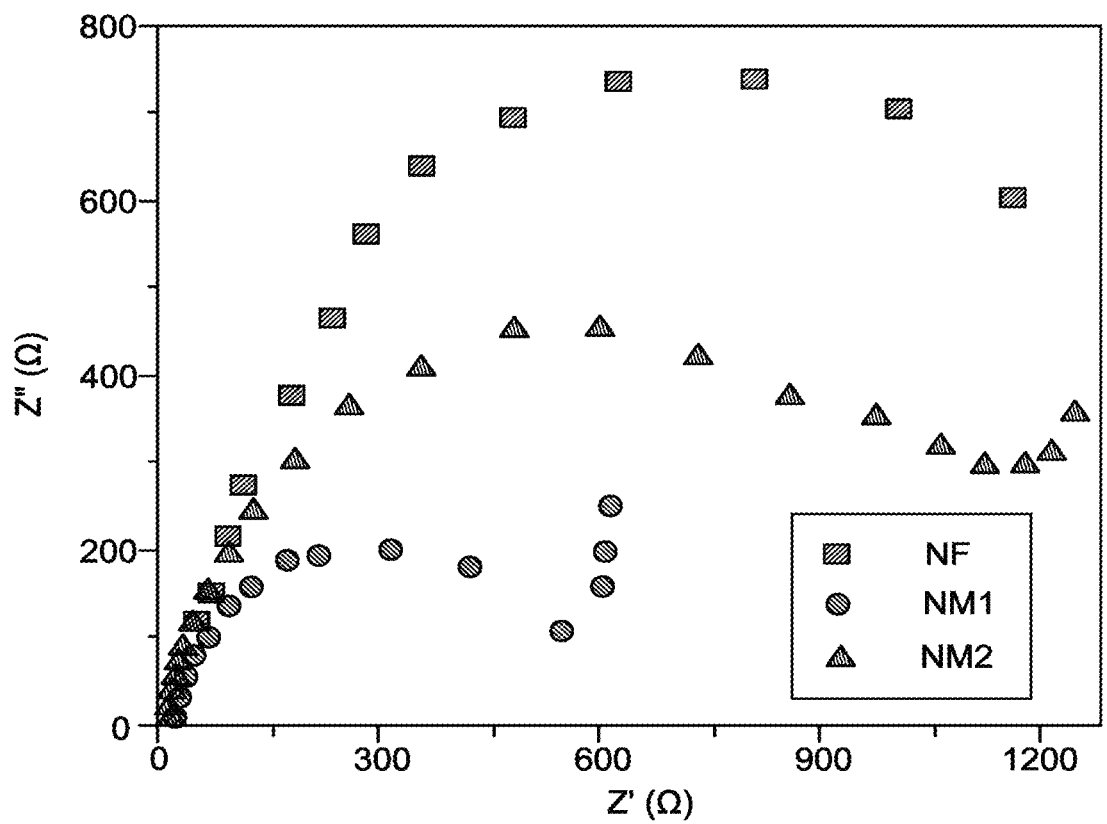
FIG. 7C shows EIS plot for the NM1 electrode.

Furthermore, electrochemical impedance spectroscopy (EIS) was performed to measure the internal resistance and charge transfer resistance at the electrode/electrolyte interface. The Nyquist plots of the synthesized materials are shown in FIG. 7c. The charge transfer resistance (Rct) is closely related to the electrocatalytic kinetics and can be determined by measuring the diameter of the semicircle. From the Nyquist plots, it is clear that the diameter of the semicircle for NMT is smaller as compared to NM2 and bare NF. The smaller diameter indicates that NMT has the minimum charge transfer resistance and faster electrode dynamics as compared to other NM2 sample. The Rct value of NMT was found to be lower than that of NM2 and bare NF.

Figure 8A:
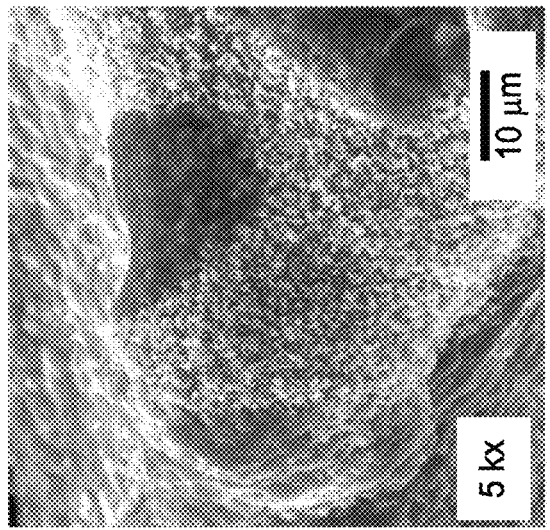
FIG. 8A shows a low resolution FESEM image of NM1 thin film electrode after long term electrochemical OER study.
Figure 8B:
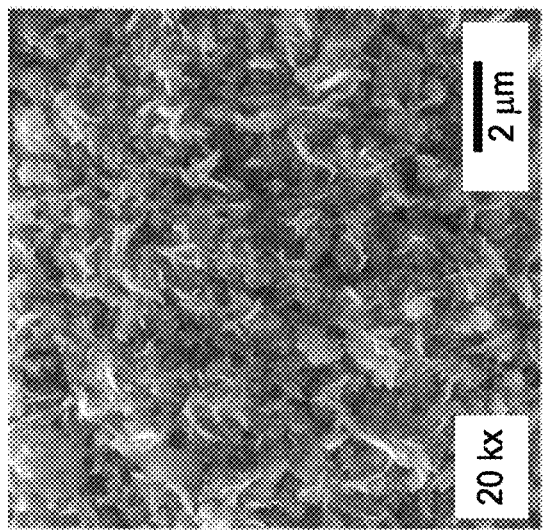
FIG. 8B shows a low resolution FESEM image of NM1 thin film electrode after long term electrochemical OER study.
Figure 8C:
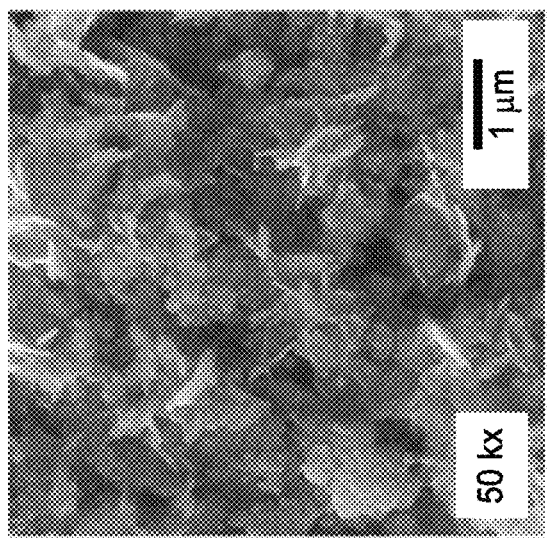
FIG. 8C shows a high resolution (50 Kx) FESEM image of NM1 thin film electrode after long term electrochemical OER study.

The surface of the NMT was analyzed after long term chronopotentiometry stability test and images are shown in FIG. 8. The FESEM images at low and high magnification reveled flake like structure and the footprints of these flakes show some resemblance with the initial flower like morphology of unused NMT electrode (FIG. 2c). This confirms that the thin film electrode after prolong stability has retained its structure with minimal deterioration.

Figure 9:
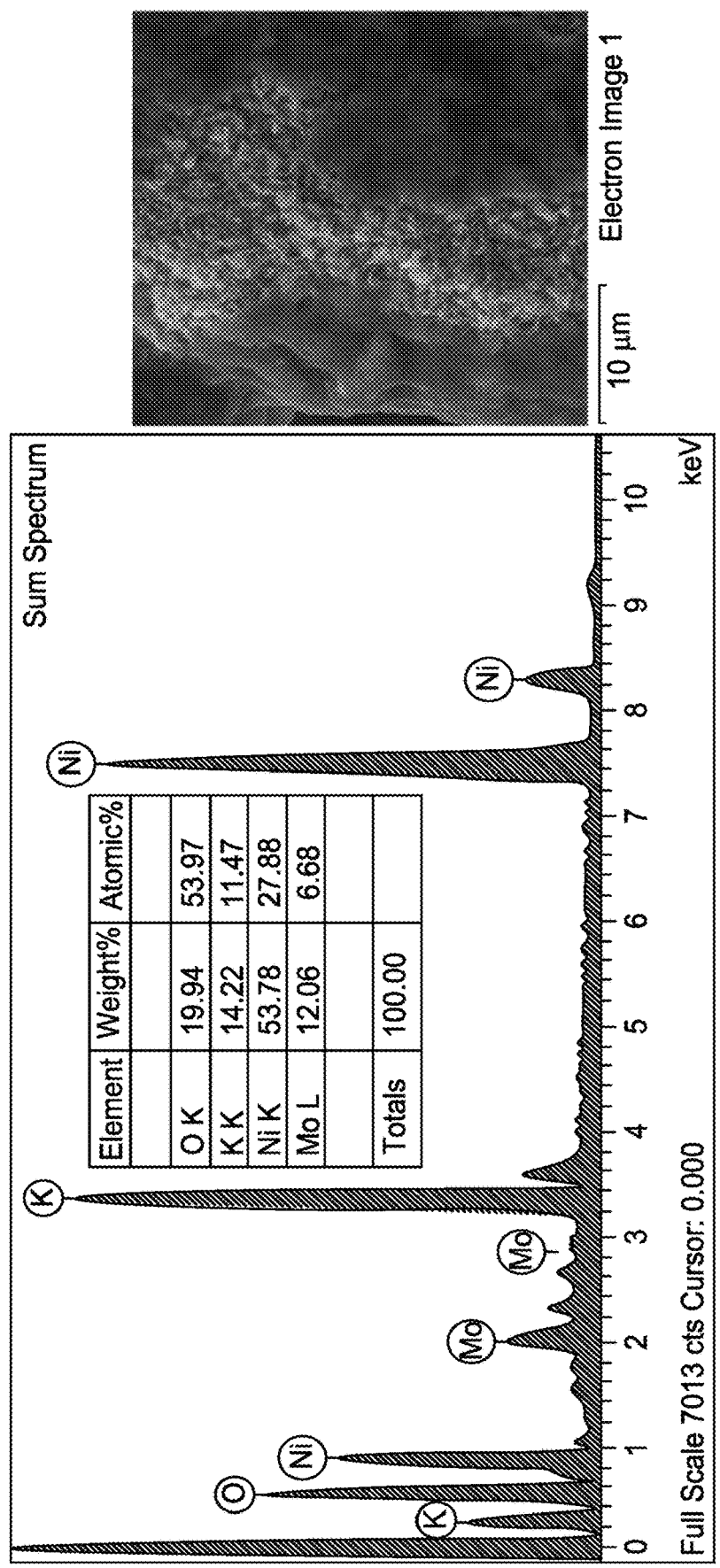
FIG. 9 shows EDX analysis of NM1 electrode after long term OER stability test.

FIG. 9. shows the corresponding EDX spectrum of NMT. Both key elements Ni, and Mo are present on the surface of used NMT; K atoms are included from KOH electrode. It is difficult to predict the exact concentration of Ni atoms due to the contributions from nickel foam substrate. However, the % atomicity of Mo atoms is found to be 4 to 10%, preferably 6.65% which is almost half of the initial % atomic concentration of Mo (13.49%) found in the NMT electrode before electrochemical investigation. The decrease in Mo atomic concentration suggests that Mo atoms are leached out during the OER process, which is a common reported phenomenon (Dirr, R. N.; Maltoni, P.; Tian, H.; Jousselme, B.; Hammarstrom, L.; Edvinsson, T. From NiMoO$_4$ to γ-NiOOH: Detecting the Active Catalyst Phase by Time Resolved in Situ and Operando Raman Spectroscopy, ACS Nano 2021, 15 (8), 13504-13515; and Sagar Ganguli; Sourav Ghosh; Soumik Das; Venkataramanan Mahalingam. Inception of Molybdate as a "Pore Forming Additive" to Enhance the Bifunctional Electrocatalytic Activity of Nickel and Cobalt Based Mixed Hydroxides for Overall Water Splitting, Nanoscale 2019, 11 (36), 16896-16906; both disclosures incorporated herein by reference).

In this study the fabrication of 2D nanoflowers of NiMoO$_4$ on nickel foam by AACVD approach has been demonstrated. The NiMoO$_4$ nanosheets grown into flower like structures with each sheets representing petals of individual flowers. The AACVD process duration has profound effect on particle morphology as well as electrocatalytic activity for oxygen evolution reaction. The film grown for 60 min showed hierarchical crystalline ultrafine and highly porous, thin films with well-defined grain boundaries. However, an increased AACVD duration, i.e., 120 min had a detrimental effect on morphology of the NiMoO$_4$ structures and hence the electrocatalytic performance. The NiMoO$_4$ catalyst obtained after 60 min of AACVD deposition exhibited relatively small overpotential value to attain current density of 10 mAcm$^{-2}$. The overpotential required to this current density was 320 mV and 360 mV for the films obtained after 60 and 120 min, respectively. The Tafel plot value also supported a higher OER kinetics which was corroborated by the low charge resistance shown by EIS measurement. In addition, the catalyst was durable and sustainable enough to continuously catalyze the OER for 15 h. This suggests that transition metal based electrocatalysts could be fabricated by simple AACVD approach that could be a potential replacement for the noble-metal based electrocatalysts for oxygen evolution reaction. As used herein, the term "noble metal" is a metal selected from the group consisting of Ru, Rh, Pd, Ag, Os, Ir, Pt, and Au.

EXAMPLES

Materials and Methods

Nickel(II) acetylacetonate ((Ni(acac)$_2$), molybdenum diacetylacetonate dioxide MoO$_2$(acac)$_2$ and methanol were obtained from Sigma Aldrich. The NF substrate of thickness 0.9 mm and porosity 93% was obtained from Good fellow global supplier for materials.

Figure 10:
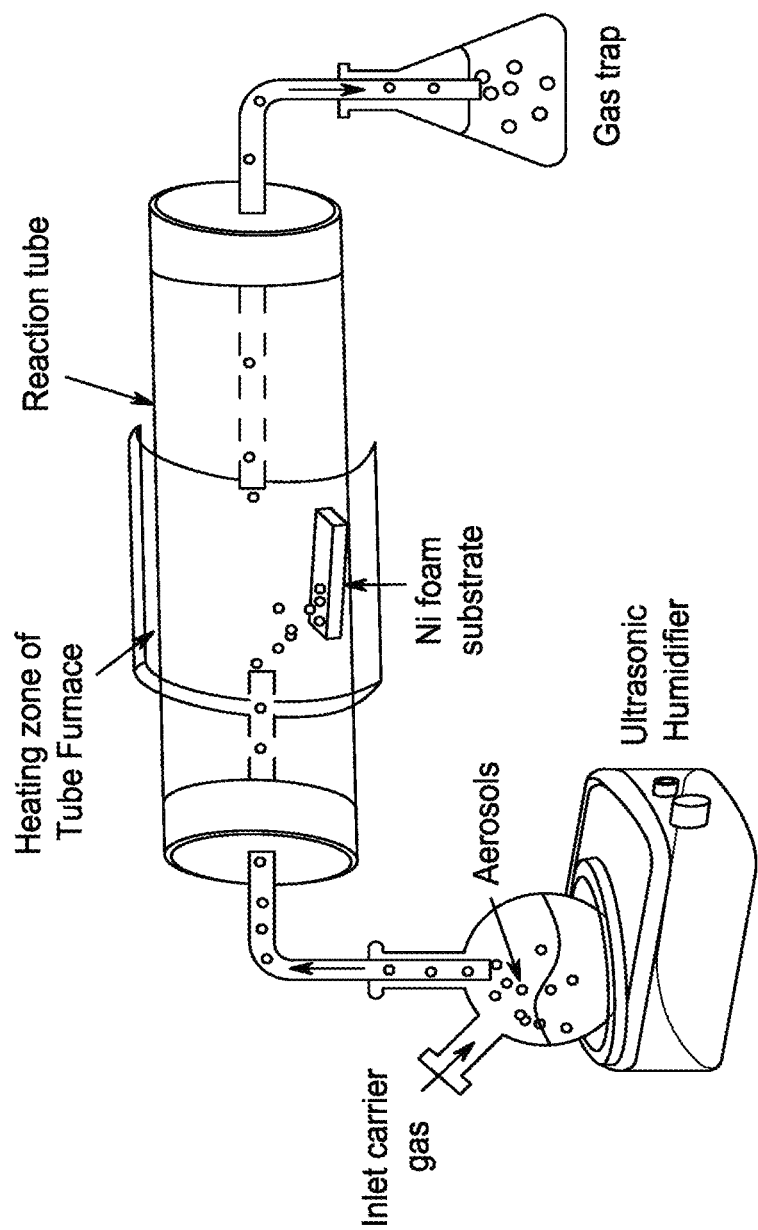
FIG. 10 shows AACVD process for synthesis of NiMoO$_4$ films on NF substrate.

Nickel molybdenum oxide thin film fabrication Solid solution NiMoO$_4$ thin films were fabricated on NF substrates using aerosol assisted chemical vapor deposition (AACVD) as shown in FIG. 10. The feedstock solution was prepared prior to AACVD process. The details of the setup and working principle of AACVD is also elaborated in Joya, K. S.; Ehsan, M. A.; Babar, N.-U.-A.; Sohail, M.; Yamani, Z. H. Nanoscale Palladium as a New Benchmark Electrocatalyst for Water Oxidation at Low Overpotential, J. Mater. Chem. A 2019, 7 (15), 9137-9144; the entire disclosure is incorporated by reference. Briefly, the precursors, 100 mg (0.4 mmol) of Ni(acac)$_2$ and 126 mg (0.4 mmol), MoO$_2$(acac)$_2$ were dissolved in 20 mL of methanol at room temperature and the solution was stirred continuously. The yellowish green solution obtained after 30-minute stirring acted as feedstock for thin films deposition. Films were prepared by altering the deposition time for 60 and 120 min at a fixed temperature of 480° C. The liquefied precursor was then converted into gaseous stream with the help of ultrasonic generator and delivered to the reactor tube, fitted in horizontal tube furnace, with aid of carrier gas ($N_2$, 99.99% purity). The temperature of tube furnace was set at 480° C. and NF substrate was positioned in such a way that precursor mist directly landed on its surface. The precursor cloud decomposed on the heated NF surface to form thin films. The AACVD process for different time periods was carried out to obtain samples with different microstructure. After completing the deposition process, samples were cooled under the flow of $N_2$ gas until furnace temperature reached to 50° C. The grey films obtained after 60 and 120 min of deposition were designated as NMT and NM2, respectively.

Thin Film Characterization

The crystallinity and phase structure of the $NiMoO_4$ films was revealed by powder XRD analysis recoded on a benchtop X-ray diffractometer (Rigaku MiniFlex X-ray diffractometer, Japan) using Cu K$\alpha$1 radiation ($\alpha$=0.15416 nm). The surface morphology of the films were analyzed on a field emission scanning electron microscope (FESEM, TESCAN Lyra). The elemental compositions were determined by energy dispersive X-ray analysis (EDX, Oxford Instruments). The chemical behavior and oxidation state of the elements involved in $NiMoO_4$ film was investigated by X-ray photoelectron spectroscopy (XPS).

Electrochemical OER Studies

The prepared electrodes were evaluated on an Autolab Potentiostat supported by NOVA 2.0 software. The electrochemical measurements were conducted in a three-electrode cell using 1 M KOH electrolyte. Platinum (Pt) and saturated calomel electrodes (SCE) served as the counter and reference electrodes, respectively. The measured potential against the reference electrode was converted to RHE scale using the equation (1).

$$E_{RHE}=E_{(Hg/HgCl)}+0.0591pH+E^0_{(Hg/HgCl)} \quad (1)$$

The Cyclic Voltammetry was performed at a scan rate of 50 mV s$^{-1}$. The OER performance was measured by linear sweep voltammetry (LSV) at 10 mVs$^{-1}$ scan rate. Chronoamperometric data was recorded at a constant applied potential of 1.57 V vs RHE for 15 h for the durability test.

Numerous modifications and variations of the present invention are possible in light of the above teachings. It is therefore to be understood that within the scope of the appended claims, the invention may be practiced otherwise than as specifically described herein.

The invention claimed is:

1. An electrocatalyst produced by aerosol-assisted chemical vapor depositing a mixture comprising $Ni(acac)_2$ and $MoO_2(acac)_2$ on a substrate to form $NiMoO_4$ nanoflowers on the substrate,
wherein the electrocatalyst comprises a continuous $NiMoO_4$ nanoflower coating of the $NiMoO_4$ nanoflowers directly on a surface of the substrate;
wherein the $NiMoO_4$ nanoflowers in the continuous $NiMoO_4$ nanoflower coating are in the form of cross-linked nanosheets consisting of $NiMoO_4$;
wherein the substrate is a nickel foam.

2. The electrocatalyst of claim 1, wherein the $NiMoO_4$ nanoflowers are crystalline by XRD, wherein the nanoflowers are in a form of irregularly aggregated nanoflakes.

3. The electrocatalyst of claim 1, wherein the electrocatalyst is produced by carrying out the aerosol-assisted chemical vapor depositing for from 30 to 200 min at a temperature of 400 to 700° C.

4. The electrocatalyst of claim 1, wherein the electrocatalyst is produced by carrying out the aerosol-assisted chemical vapor depositing for from 60 to 120 min at a temperature from 430 to 540° C.

5. The electrocatalyst of claim 1, wherein the $NiMoO_4$ nanoflowers of the electrocatalyst produced after 40 to 90 minutes of the aerosol-assisted chemical vapor depositing have a Tafel value of 50 to 100 mV dec$^{-1}$.

6. The electrocatalyst of claim 1, wherein the electrocatalyst has a constant current density after 10 to 20 hours with 7-15 mA cm$^{-2}$.

7. The electrocatalyst of claim 1, wherein the $NiMoO_4$ nanoflowers are crystalline.

8. The electrocatalyst of claim 1, wherein the $NiMoO_4$ nanoflowers consist of a crystalline single phase $NiMoO_4$.

9. The electrocatalyst of claim 1, wherein the $NiMoO_4$ nanoflowers in the continuous $NiMoO_4$ nanoflower coating include vertically aligned nanosheets.

10. The electrocatalyst of claim 1, wherein the $NiMoO_4$ nanoflowers have a crystalline single phase by XRD and XPS.

11. A method of using the electrocatalyst of claim 1 for water oxidation, comprising:
contacting the electrocatalyst with an aqueous electrolyte solution having a pH of 8 to 14; and
applying a potential of 1.30 to 1.70 V to the electrocatalyst and a counter electrode immersed in the aqueous electrolyte solution.

* * * * *